US011940696B2

(12) United States Patent
Nemoto et al.

(10) Patent No.: US 11,940,696 B2
(45) Date of Patent: Mar. 26, 2024

(54) DISPLAY DEVICE

(71) Applicant: Sharp Display Technology Corporation, Kameyama (JP)

(72) Inventors: Takahiro Nemoto, Kameyama (JP); Shogo Nishiwaki, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/137,402

(22) Filed: Apr. 20, 2023

(65) Prior Publication Data

US 2023/0341729 A1 Oct. 26, 2023

(30) Foreign Application Priority Data

Apr. 26, 2022 (JP) ................................ 2022-072285

(51) Int. Cl.
| | |
|---|---|
| G02F 1/1343 | (2006.01) |
| G02F 1/1362 | (2006.01) |
| G06F 1/16 | (2006.01) |
| H01L 27/12 | (2006.01) |

(52) U.S. Cl.
CPC .... *G02F 1/134309* (2013.01); *G02F 1/13439* (2013.01); *G02F 1/136286* (2013.01); *G06F 1/163* (2013.01); *H01L 27/124* (2013.01)

(58) Field of Classification Search
None
See application file for complete search history.

(56) References Cited

U.S. PATENT DOCUMENTS

| | | | | |
|---|---|---|---|---|
| 2012/0218501 | A1* | 8/2012 | Lee .................... | G02F 1/134309 349/139 |
| 2013/0038825 | A1* | 2/2013 | Nishida ............. | G02F 1/134363 349/113 |
| 2015/0062521 | A1* | 3/2015 | Son .................... | G02F 1/133345 349/138 |
| 2015/0346564 | A1* | 12/2015 | Moriwaki ......... | G02F 1/136286 349/138 |
| 2016/0266448 | A1* | 9/2016 | Lee ........................ | G02F 1/1337 |
| 2018/0252974 | A1* | 9/2018 | Okita .................... | G02F 1/1368 |
| 2019/0146254 | A1* | 5/2019 | Huang, Jr. ............. | G02F 1/1368 349/12 |
| 2020/0150497 | A1* | 5/2020 | Nishiwaki ......... | G02F 1/133707 |

FOREIGN PATENT DOCUMENTS

| | | |
|---|---|---|
| JP | 2018146694 A | 9/2018 |
| WO | WO-2018043313 A1 * | 3/2018 |

* cited by examiner

*Primary Examiner* — Ryan Crockett
(74) *Attorney, Agent, or Firm* — ScienBiziP, P.C.

(57) ABSTRACT

According to an aspect of the disclosure, a display device includes a first substrate, a second substrate, a first wire, a first electrode adjacent to the first wire and closer to the second substrate than the first wire, a second electrode closer to the second substrate than the first electrode and disposed to overlap the first wire and the first electrode, a first overlap section, disposed to overlap at least the first wire, that blocks light, and a third electrode closer to the second substrate than the first wire and further away from the second substate than the first electrode. A plurality of slits is formed in the second electrode, the plurality of slits being placed at spacings from one another and cutting across the first wire and the first electrode. The third electrode is disposed to overlap at least both the first wire and the slits.

9 Claims, 19 Drawing Sheets

DIRECTION OF ALIGNMENT

DIRECTION OF ALIGNMENT

DISPLAY DEVICE

CROSS-REFERENCE TO RELATED APPLICATIONS

This application claims the benefit of priority to Japanese Patent Application Number 2022-072285 filed on Apr. 26, 2022. The entire contents of the above-identified application are hereby incorporated by reference.

BACKGROUND

1. Field

The present disclosure relates to a display device.

2. Description of the Related Art

There has been known an example of a conventional display device described in Japanese Unexamined Patent Application Publication No. 2018-146694. The display device described in Japanese Unexamined Patent Application Publication No. 2018-146694 includes a plurality of video lines and a plurality of scanning lines both laid on an insulating substrate, a light-blocking film that overlaps the plurality of video lines and the plurality of scanning lines, a pixel electrode and a common electrode both situated in a subpixel area surrounded by a plurality of video lines and a plurality of scanning lines in planar view, a liquid crystal layer that is driven by an electric field generated between the pixel electrode and the common electrode, and a first insulating layer situated between the pixel electrode and the common electrode. The common electrode is situated between the first insulating layer and the liquid crystal layer, overlaps the plurality of video lines and the plurality of scanning lines, and has an opening that overlaps the pixel electrode. In a light transmission area surrounded by the light-blocking film, the pixel electrode is in the shape of a line having no bifurcation.

In the case of a display device such as that described in Japanese Unexamined Patent Application Publication No. 2018-146694, lateral misregistration of the light-blocking film with respect to the video lines, the pixel electrode, or other components during bonding of an array substrate and a counter substrate causes a portion of the pixel electrode that is not supposed to be shielded from light by the light-blocking film to be shieled from light and causes a portion of the pixel electrode that is supposed to be shielded from light by the light-blocking film not to be shielded from light. This results in a decrease in the amount of light that is transmitted through the pixel electrode. In the display device described in Japanese Unexamined Patent Application Publication No. 2018-146694, the opening of the common electrode is disposed only within range of the pixel electrode, or specifically, one vertically long opening is disposed to overlap the pixel electrode. This has tended to put a great distance between a portion of the pixel electrode that is furthest away from an edge of the opening and the edge of the opening. Note here that the amount of light that is transmitted through the pixel electrode tends to decrease with distance from the edge of the opening. Based on this tendency, the amount of light that is transmitted through the portion of the pixel electrode that is furthest away from the edge of the opening becomes very small if the aforementioned misregistration causes the portion not to be shielded from light by the light-blocking film. This has caused such a problem that the amount of light that is transmitted through the pixel electrode significantly decreases due to the misregistration.

It is desirable to restrain a decrease in the amount of transmitted light.

SUMMARY

According to an aspect of the disclosure, there is provided a display device including a first substrate, a second substrate having a principal surface facing a principal surface of the first substrate, a first wire, provided in the first substrate, that extends along a first direction parallel with the principal surface of the first substrate, a first electrode provided in the first substrate, disposed adjacent to the first wire in a second direction parallel with the principal surface of the first substrate and orthogonal to the first direction, and located closer to the second substrate than the first wire, a second electrode provided in the first substrate, located closer to the second substrate than the first electrode, and disposed to overlap the first wire and the first electrode, a first overlap section, provided in the second substrate and disposed to overlap at least the first wire, that extends along the first direction and that blocks light, and a third electrode provided in the first substrate, located closer to the second substrate than the first wire, and located further away from the second substate than the first electrode. A plurality of slits is formed in the second electrode, the plurality of slits being placed at spacings from one another, extending along an orientation parallel with the principal surface of the first substrate that intersects the first direction, and cutting across the first wire and the first electrode. The third electrode is disposed to overlap at least both the first wire and the slits.

DESCRIPTION OF THE EMBODIMENTS

Embodiment 1

Embodiment 1 is described with reference to FIGS. 1 to 19. The present embodiment illustrates a goggle-type head-mounted display (HMD) 10HMD and a liquid crystal display device 10 used therein. It should be noted that some of the drawings show an X axis, a Y axis, and a Z axis and are drawn so that the direction of each axis is an identical direction in each drawing.

Figure 1:
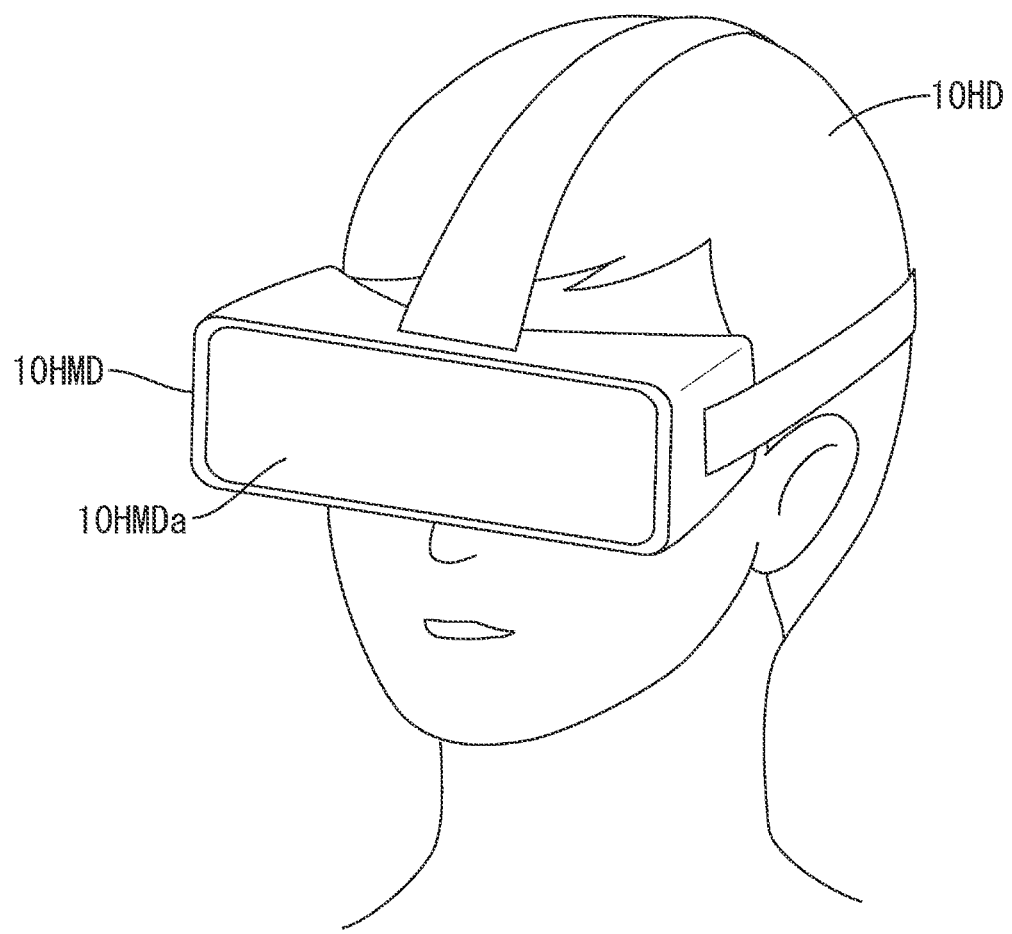
FIG. 1 is a schematic perspective view showing a head-mounted display according to Embodiment 1 worn on the head of a user.

The external appearance of the goggle-type head-mounted display 10HMD is described with reference to FIG. 1. As shown in FIG. 1, the head-mounted display 10HMD includes a head-mounted instrument 10HMDa that is worn on the head 10HD of a user. The head-mounted instrument 10HMDa surrounds both eyes of the user.

Figure 2:
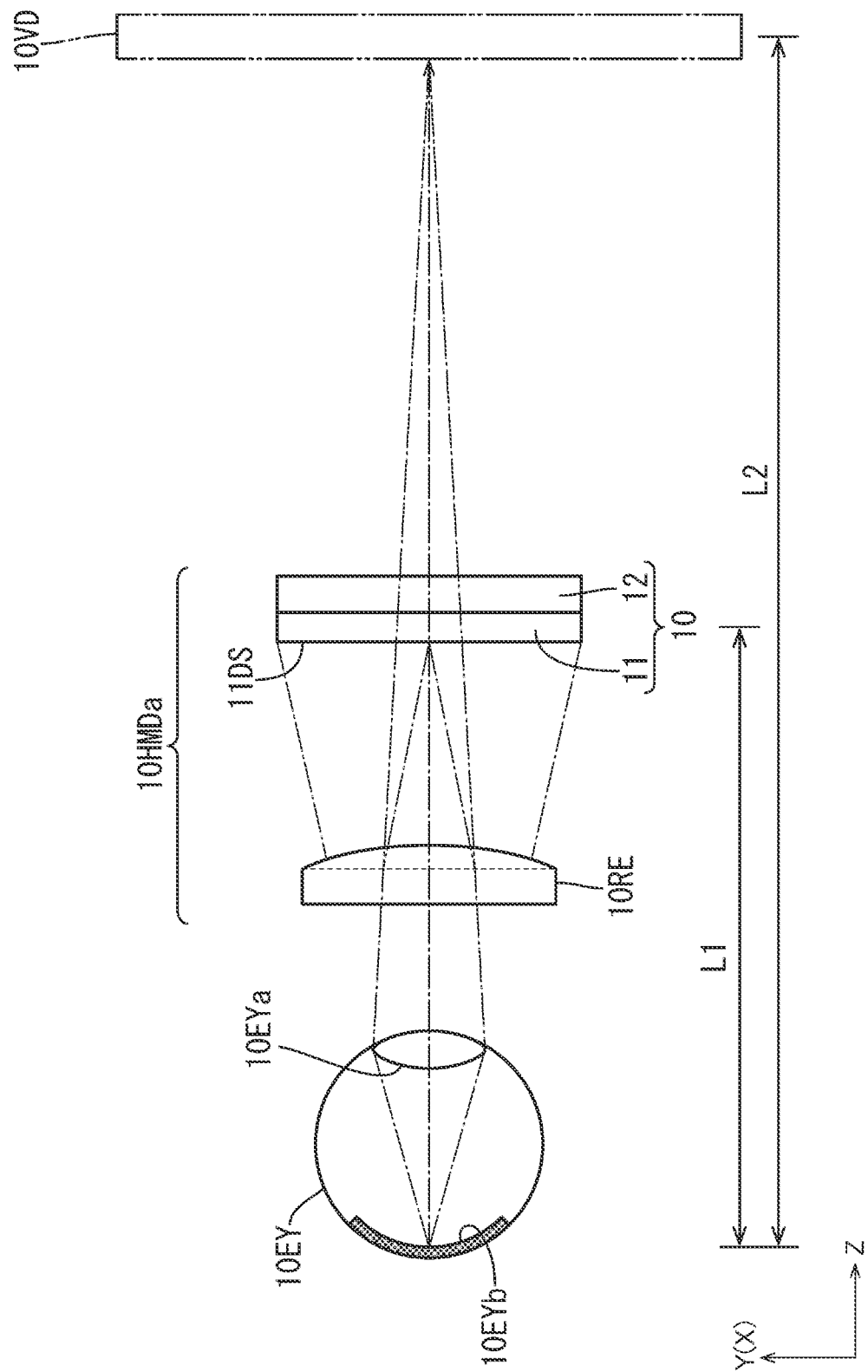
FIG. 2 is a schematic side view showing an optical relationship between a liquid crystal display device and a lens unit of a head-mounted instrument of the head-mounted display and an eyeball of the user.

A configuration of the head-mounted instrument 10HMDa is described with reference to FIG. 2. As shown in FIG. 2, the head-mounted instrument 10HMDa contains at least the liquid crystal display device 10, which displays an image, and a lens unit 10RE that causes an image displayed on the liquid crystal display device 10 to be formed on an eyeball 10EY of the user. The liquid crystal display device 10 includes at least a liquid crystal panel (display device) 11 and a backlight device (lighting device) 12 that illuminates the liquid crystal panel 11 with light. A principal surface of the liquid crystal panel 11 that faces the lens unit 10RE is a display surface 11DS on which an image is displayed. The lens unit 10RE is disposed to intervene between the liquid crystal display device 10 and the eyeball 10EY of the user. The lens unit 10RE effects refraction of light. Adjusting the focal length of the lens unit 10RE allows the user to recognize that an image formed on a retina 10EYb via the crystalline lens 10EYa of the eyeball 10EY is being displayed on a virtual display 10VD that is apparently present in a position at a distance L2 from the eyeball 10EY. The distance L2 is much greater than an actual distance L1 from the eyeball 10EY to the liquid crystal display device 10. This allows the user to view an enlarged image that is a virtual image displayed on the virtual display 10VD, whose screen size (e.g. approximately several tens of inches to several hundreds of inches) is much larger than the screen size (e.g. approximately several tenths of an inch to several inches) of the liquid crystal display device 10.

It should be noted that it is possible to provide the head-mounted instrument 10HMDa with one liquid crystal display device 10 and configure the liquid crystal display device 10 to display an image for the right eye and an image for the left eye. Alternatively, it is also possible to provide the head-mounted instrument 10HMDa with two liquid crystal display devices 10, configure one liquid crystal display device 10 to display an image for the right eye, and configured the other liquid crystal display device 10 to display an image for the left eye. Further, the head-mounted instrument 10HMDa may be provided with an earphone or other devices that are put over the ears of the user and that emit a sound.

Figure 3:
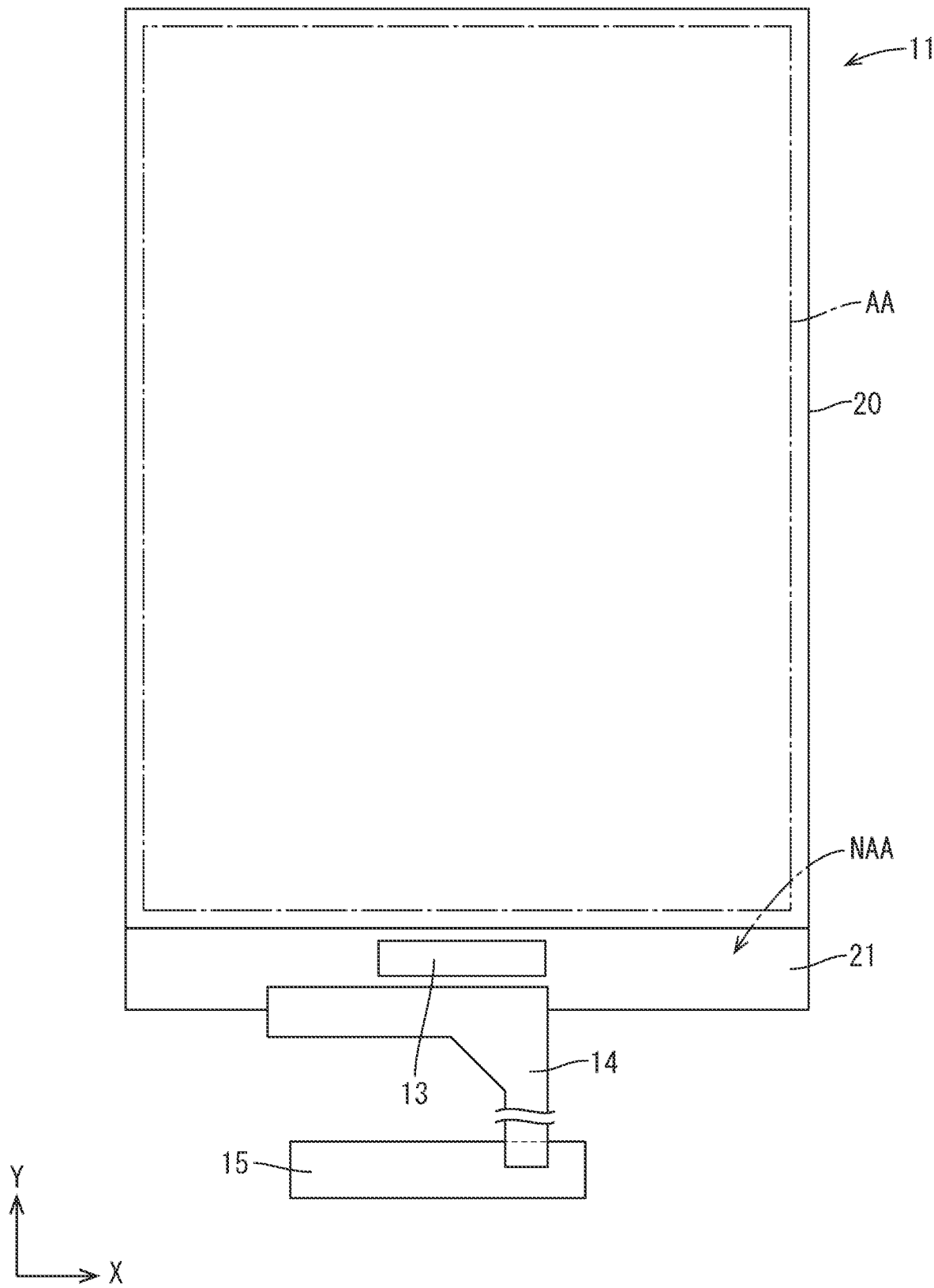
FIG. 3 is a schematic plan view showing a connection configuration among a liquid crystal panel of the liquid crystal display device, a flexible substrate, and a control circuit substrate.

A configuration of the liquid crystal panel 11 of the liquid crystal display device 10 is described with reference to FIG. 3 or other drawings. It should be noted that the backlight device 12 is configured as already known and includes a light source such as an LED and an optical member that converts light from the light source into surface light by imparting an optical effect to the light from the light source. In the liquid crystal panel 11, as shown in FIG. 3, a driver 13 for performing display driving and a flexible substrate 14 are mounted via an ACF (anisotropic conductive film). Connected to the flexible substrate 14 is a control circuit substrate (signal supply source) 15 that supplies the driver 13 with various types of input signal from an outside source.

As shown in FIG. 3, a central portion of the principal surface of the liquid crystal panel 11 is a display area (active area) AA on which an image can be displayed. An outer peripheral portion of the principal surface of the liquid crystal panel 11 that surrounds the display area AA is a non-display area (non-active area) NAA having the shape of a frame when seen in planar view. In FIG. 3, the outer shape of the display area NAA is indicated by dot-and-dash lines, and the non-display area NAA is an area that is further outward than the dot-and-dash lines. The liquid crystal panel 11 is formed by bonding a pair of substrates 20 and 21 together. Of the pair of substrates 20 and 21, a front (frontal) substrate is a counter substrate (second substrate, CF substrate) 20. Of the pair of substrates 20 and 21, a back (rear) substate is an array substrate (first substrate, active matrix substrate) 21. The counter substrate 20 and the array substrate 21 are disposed so that their respective inner principal surfaces (inner surfaces) face each other. The respective principal surfaces of the counter substrate 20 and the array substrate 21 are surfaces extending along an X-axis direction and a Y-axis direction, and a direction normal to the principal surfaces is parallel with a Z-axis direction. The counter substrate 20 and the array substrate 21 include substantially transparent glass substrates (substrates) 20GS and 21GS, respectively, and are each formed by joining various films on top of each other on the inner surface of a corresponding one of the glass substates 20GS and 21GS. It should be noted that polarizing plates are joined separately to each of the outer surfaces of the two substrates 20 and 21.

Figure 4:
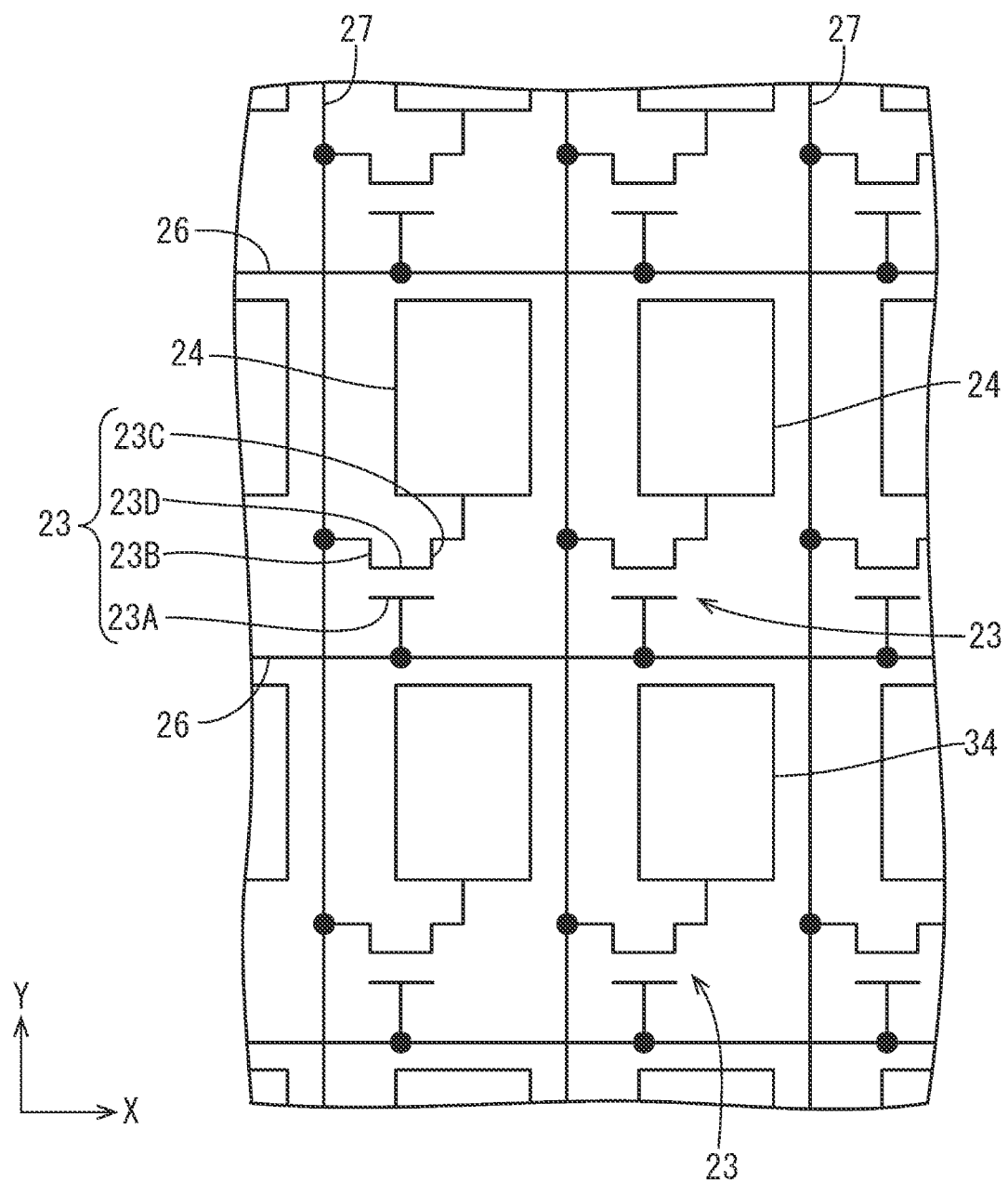
FIG. 4 is a circuit diagram showing a pixel array in a display area of an array substrate of the liquid crystal panel.

A brief overview of a pixel array of the array substrate 21 in the display area AA is given with reference to FIG. 4. In the inner surface of the array substrate 21 in the display area AA, as shown in FIG. 4, a plurality of gate wires (second wires, scanning wires) 26 and a plurality of source wires (first wires, image wires) 27 are disposed in a grid pattern. Provided near an intersection of a gate wire 26 and a source wire 27 are a TFT (switching element, thin-film transistor) 23 and a pixel electrode (first electrode) 24. Each of the gate wires 26 extends along the X-axis direction (second direction) in such a manner as to traverse the display area AA, and is connected to a gate electrode 23A of each TFT 23. A plurality of the gate wires 26 are placed side-by-side at spacings from one another in the Y-axis direction (first direction) orthogonal to the X-axis direction. Each of the source wires 27 extends along the Y-axis direction in such a manner as to traverse longitudinally the display area AA, and is connected to a source electrode 23B of each TFT 23. A plurality of the source wires 27 are placed at spacings from one another in the X-axis direction. A plurality of the TFTs 23 and a plurality of the pixel electrodes 24 are regularly arranged along the X-axis direction and the Y-axis direction and planarly arranged in a matrix (rows and columns). Each of the pixel electrodes 24 is connected to a drain electrode 23C of a corresponding one of the TFTs 23. Each of the TFTs 23 includes a semiconductor section 23D in addition to the aforementioned gate electrode 23A, source electrode 23B, and drain electrode 23C. The semiconductor section 23D is composed of a semiconductor material, and is connected to the source electrode 23B and the drain electrode 23C. Moreover, when driven based on a scanning signal that is supplied to the gate wire 26, the TFT 23 charges the pixel electrode 24 to a potential based on an image signal (data signal) that is supplied to the source wire 27. The aforementioned gate wire 26, source wire 27, and TFT 23 constitute a pixel circuit, i.e. a circuit that drives a pixel.

Figure 5:
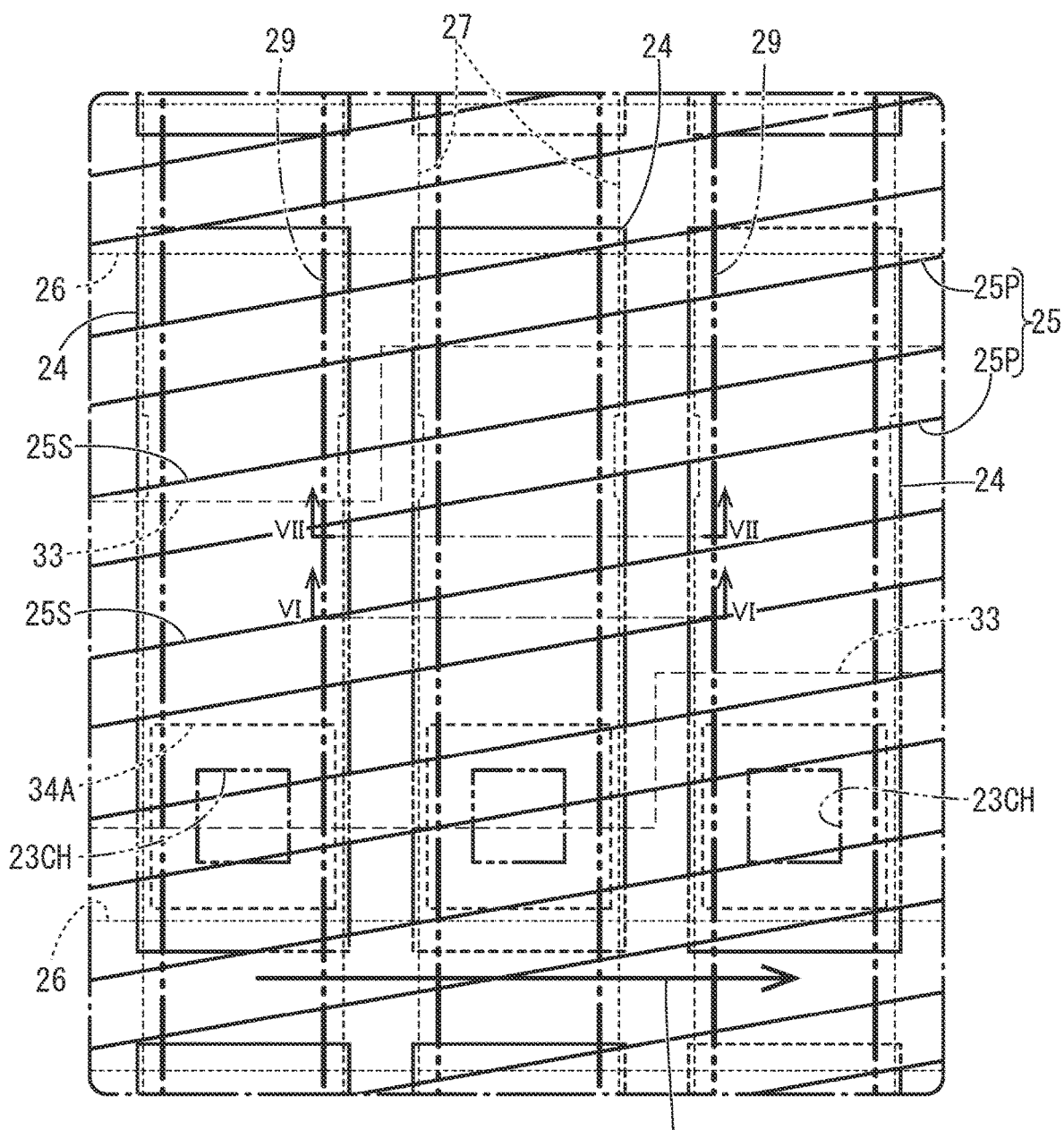
FIG. 5 is a plan view showing a pixel array in the display area of the liquid crystal panel.
Figure 5:
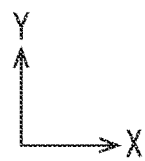

The pixel array of the array substrate 21 in the display area AA is specifically described with reference to FIG. 5. FIG. 5 illustrates a row of three pixels arranged in the X-axis direction. As shown in FIG. 5, each of the pixel electrodes 24 is formed in the shape of a vertically long square when seen in planar view. The pixel electrode 24 is disposed in an area surrounded by two gate wires 26 placed at a spacing from each other in the Y-axis direction and two source wires 27 placed at a spacing from each other in the X-axis direction. A short side of the pixel electrode 24 is approximately ⅓ as long as a long side of the pixel electrode 24. The array spacing between a plurality of source wires 27 arranged at a spacing from each other in the X-axis direction is approximately ⅓ of the array spacing between a plurality of gate wires 26 arranged at a spacing from each other in the Y-axis direction.

As shown in FIG. 5, each of the gate wires 26 has a line width that is slightly greater than the spacing between two pixel electrodes 24 that are adjacent to each other in the Y-axis direction. Accordingly, both lateral edges of the gate wire 26 extending along the X-axis direction slightly overlap ends in the Y-axis direction of the two pixel electrodes 24 that are adjacent to each other in the Y-axis direction, respectively. Disposed above the gate wire 26 in FIG. 5 is a first contact hole 23CH overlapping both a pixel electrode 24 and the drain electrode 23C of a TFT 23. The first contact hole 23CH is bored through insulating films (i.e. a second insulating film F2 and a third insulating film F3, which will be described later) intervening between the pixel electrode 24 and the drain electrode 23C. The pixel electrode 24 is connected to the drain electrode 23C through the first contact hole 23C. The first contact hole 23CH is disposed near an end of the pixel electrode 24 on one side (i.e. a lower side of FIG. 5) in the Y-axis direction. It should be noted that the drain electrode 23C has the shape of a square that is a size larger than the contact hole 23CH when seen in planar view.

As shown in FIG. 5, each of the source wires 27 has a line width that is slightly greater than the spacing between two pixel electrodes 24 that are adjacent to each other in the X-axis direction. Accordingly, both lateral edges of the source wire 27 extending along the Y-axis direction slightly overlap ends in the X-axis direction of the two pixel electrodes 24 that are adjacent to each other in the X-axis direction, respectively. It should be noted that the source wire 27 is smaller in line width than a gate wire 26. The source wire 27 has a widened portion that constitutes the source electrode 23B of a TFT 23. The source electrode 23B is placed further away in the Y-axis direction from the gate electrode 23A than the aforementioned drain electrode 23C. One end of the semiconductor section 23D is connected to the source electrode 23B. Further, the other end of the semiconductor section 23D is connected to the drain electrode 23C. It should be noted that the semiconductor section 23D is bent more than once in the middle so as to cross longitudinally two gate electrodes 23A in the process of extending from the source electrode 23B to the drain electrode 23C.

Figure 6:
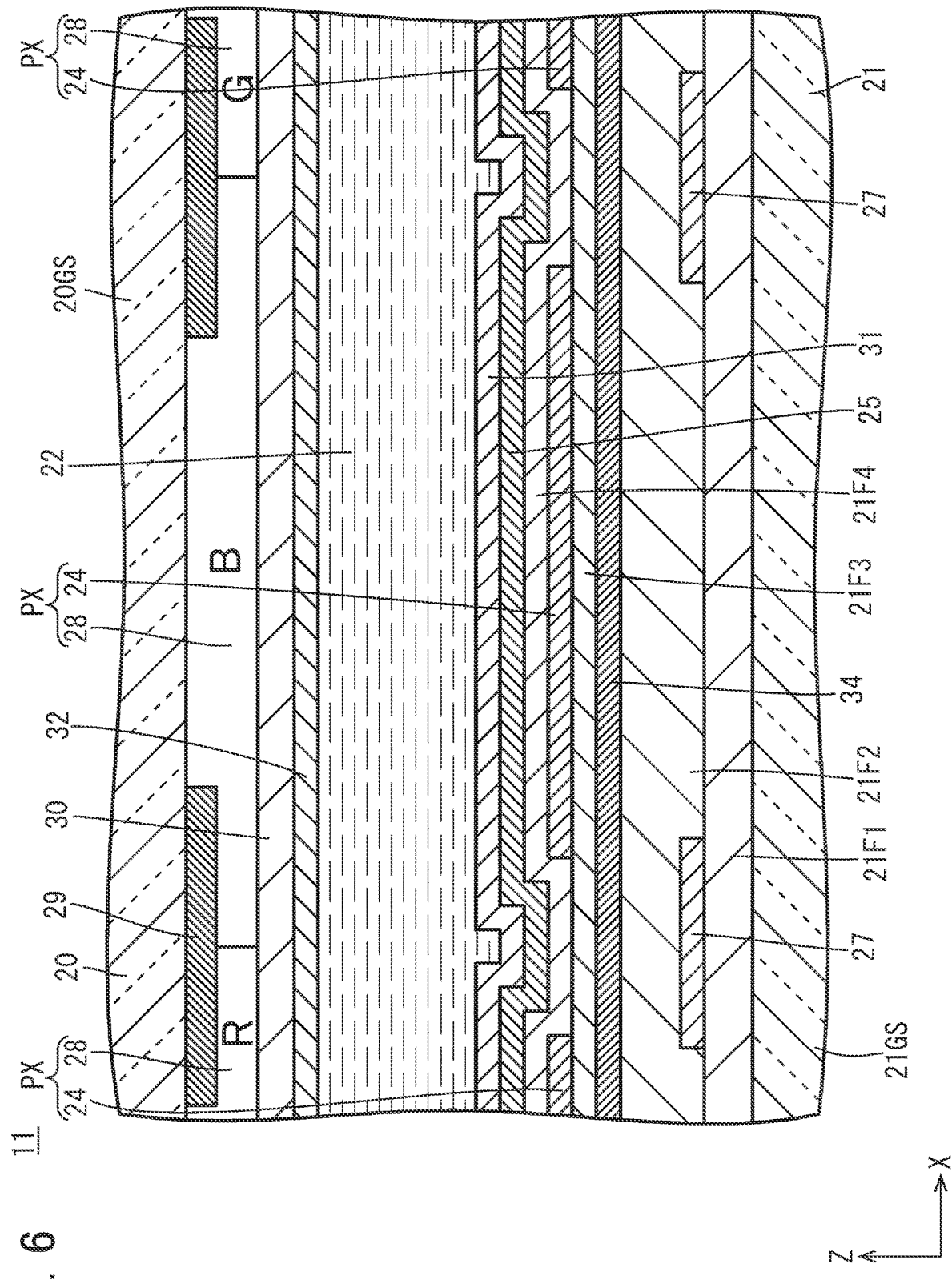
FIG. 6 is a cross-sectional view of the liquid crystal panel as taken along line VI-VI in FIG. 5.

A cross-sectional configuration of the liquid crystal panel 11 near a central part of a pixel PX is described mainly with reference to FIG. 6. As shown in FIG. 6, the liquid crystal panel 11 includes a liquid crystal layer (medium layer) 22, disposed between the pair of substrates 20 and 21, that contains liquid crystal molecules that make up a substance whose optical properties vary in the presence of the application of an electric field. Provided in the inner surface of the counter substrate 20 in the display area AA of the liquid crystal panel 11 are color filters 28 of three colors, namely blue (B), green (G), and red (R). The plurality of color filters 28 of different colors are disposed side-by-side so as to be adjacent to one another in a direction of extension (X-axis direction) of the gate wires 26. The plurality of color filters 28 of different colors extend substantially along a direction of extension (substantially the Y-axis direction) of the source wires 27. In this way, the plurality of color filters 28 of different colors are arrayed in stripes as a whole. These color filters 28 are arranged to each overlap a corresponding one of the pixel electrodes 24 of the array substrate 21 when seen in planar view. The plurality of color filters 28 of different colors are arranged so that their boundaries (color boundaries) overlap the source wires 27. In this liquid crystal panel 11, R, G, and B color filters 28 lined up along the X-axis direction and three pixel electrodes 24 each facing a corresponding one of the color filters 28 constitute pixels PX of three colors. Moreover, in this liquid crystal panel 11, a display pixel that is capable of a color display at a predetermined level of gray is constituted by pixels PX of three colors, namely R, G, and B, that are adjacent to one another along the X-axis direction. The array pitches of pixels PX in the Y-axis direction are approximately three times as great as the array pitches of pixels PX in the X-axis direction.

The liquid crystal panel 11 according to the present embodiment, which is used in the aforementioned head-mounted display 10HMD, is very high in definition, and the array pitches of pixels PX in the X-axis direction are for example approximately 6 µm. It should be noted that the liquid crystal panel 11 has a pixel density of, for example, approximately 1410 ppi. Meanwhile, the gate wires 26 and the source wires 27 have line widths of, for example, approximately 1.5 µm to 2.5 µm.

As shown in FIGS. 5 and 6, the counter substrate 20 is provided with a first light-blocking section (first overlap section, black matrix) 29 that divides the plurality of color filters 28 of different colors from one another. The first light-blocking section 29 is composed of a light-blocking material having a light-blocking effect (e.g. a material containing a photosensitive resin material such as acrylic or polyimide and a pigment such as carbon black). The first light-blocking section 29 blocks, for example, light emitted from the backlight device 12. The first light-blocking section 29 extends substantially linearly along the Y-axis direction, and a plurality of the first light-blocking sections 29 are placed side-by-side at spacings from one another so that the color filters 28 are interposed in the X-axis direction. The first light-blocking section 29 is disposed to overlap the source wires 27 of the array substrate 21. The first light-blocking section 29 can cooperate with the source wires 27 to avoid formation of a mixture of colors among pixels PX of different colors. A width dimension (dimension in the X-axis direction) of the first light-blocking section 29 is greater than the line width of a source wire 27. Accordingly, both lateral edges of the first light-blocking section 29 extending along the Y-axis direction overlap ends along the Y-axis direction of two pixel electrodes 24 that are adjacent to each other in the X-axis direction. A width of overlap between the first light-blocking section 29 and a pixel electrode 24 is greater than a width of overlap between a source wire 27 and a pixel electrode 24. Further provided on the upper layer side of the color filter 28 (that faces the liquid crystal layer 22) is an overcoat film 30 solidly disposed over substantially the entirety of the counter substrate 20 for the sake of planarization. Formed on the innermost surfaces (uppermost layers) of the two substrates 20 and 21 that are in contact with the liquid crystal layer 22 are alignment films 31 and 32 for aligning liquid crystal molecules contained in the liquid crystal layer 22, respectively. By having their surfaces subjected to optical alignment processing, the alignment films 31 and 32 become optical alignment films capable of applying an alignment restraining force to the liquid crystal molecules. FIG. 5 uses an arrow to indicate the direction of alignment (tilt direction, direction of the liquid crystal molecules in the absence of the application of a voltage to the liquid crystal layer 22) of the liquid crystal molecules that are aligned by the alignment films 31 and 32. In the present embodiment, the direction of alignment of the liquid crystal molecules is parallel with the X-axis direction. The direction of alignment of the liquid crystal molecules is parallel with the direction of irradiation with alignment processing light that is shone on the alignment films 31 and 32 in a manufacturing process.

In the inner surface of the array substrate 21 in the display area AA, as shown in FIG. 6, a common electrode (second electrode, upper common electrode) 25 overlapping all pixel electrodes 24 is provided. The common electrode 25 is formed at a higher layer than the pixel electrodes 24. The common electrode 25 extends over substantially the entirety of at least the display area AA. The common electrode 25 has formed therein a slit 25S described below. The common electrode 25 is supplied with a common potential signal (reference potential signal) of a common potential (reference potential). Charging a pixel electrode 24 causes a potential difference between an edge of a slit 25S of the common electrode 25 and the pixel electrode 24, which overlap each other. Then, between the pixel electrode 24 and the common electrode 25, a fringe field (oblique field) including, in addition to a component acting parallel to the principal surface of the array substrate 21, a component acting normal to the principal surface of the array substrate 21 is generated. Utilizing this fringe field makes it possible to control the state of alignment of the liquid crystal molecules contained in the liquid crystal layer 22. That is, the liquid crystal panel 11 according to the present embodiment operates in a mode called "FFS (fringe field switching) mode". A configuration of the common electrode 25 will be described in detail later.

Various films joined on top of each other on the glass substrate 21GS of the array substrate 21 are described in detail here with reference to FIG. 6. On the glass substrate 21GS of the array substrate 21, as shown in FIG. 6, at least a first metal film (first light-blocking film), a basecoat film, a semiconductor film, a first insulating film (gate insulating film), a second metal film, a second insulating film 21F1, a third metal film, a third insulating film 21F2, a first transparent electrode film, a fourth insulating film 21F3, a second transparent electrode film, a fifth insulating film 21F4, a third transparent electrode film, the alignment film 31 are joined on top of each other in this order from a lower level (glass substrate 21GS). It should be noted that FIG. 6 illustrates films that are at a higher layer than the second metal film.

The first metal film, the second metal film, and the third metal film each have electric conductivity and a light-blocking effect by being a single-layer film composed of one type of metal material or a laminated film or alloy composed of different types of metal material. The semiconductor film is composed of a CG silicon (continuous grain silicon) thin film that is a type of polycrystalline silicon thin film (polycrystal silicon thin film). The CG silicon thin film is formed, for example, by adding a metal material to an amorphous silicon thin film and performing brief heat treatment at a low temperature approximately lower than or equal to 550° C., thereby having a continuous array of atoms at a grain boundary between silicon crystals. The first transparent electrode film, the second transparent electrode film, and the third transparent electrode film are composed of a transparent electrode material such as ITO (indium tin oxide) or IZO (indium zinc oxide). The basecoat film, the first insulating film, the second insulating film 21F1, the fourth insulating film 21F3, and the fifth insulating film 21F4 are composed of $SiO_2$ (oxide silicon, silicon oxide), $SiN_X$ (silicon nitride), or other materials each of which is a type of inorganic material (inorganic resin material). The third insulating film 21F2 is composed of PMMA (acrylic resin) that is a type of organic material (organic resin material). The third insulating film 21F2, which is composed of an organic material, is usually greater in film thickness than the basecoat film, the first insulating film, the second insulating film 21F1, the fourth insulating film 21F3, and the fifth insulating film 21F4, which are composed of an inorganic material.

As shown in FIG. 5, the semiconductor film constitutes the semiconductor section 23D of the TFT 23. The second metal film constitutes the gate wires 26, the gate electrode 23A of the TFT 23, or other components. The first insulating film intervenes between the semiconductor section 23D and the gate electrode 23A, which overlap each other, and keeps the spacing between them at a predetermined value. Thus, the TFT 23 according to the present embodiment is of a so-called top-gate type in which the gate electrode 23A is disposed at a higher layer than the semiconductor section 23D to overlap the semiconductor section 23D via the first insulating film. The third metal film constitutes the source wires 27, the source electrode 23B and drain electrode 23C of the TFT 23, or other components. The second insulating film 21F1 intervenes between the gate wires 26 and the source wires 27, which intersect each other, and insulates them from each other. The second transparent electrode film constitutes the pixel electrode 24. The already-described first contact hole 23CH is bored through the third insulating film 21F2 and the fourth insulating film 21F3, which intervene between the third metal film and the second transparent electrode film, so as to be in such a position as to overlap both the drain electrode 23C and the pixel electrode 24. The third transparent electrode film constitutes the common electrode 25. The fifth insulating film 21F4, which intervenes between the second transparent electrode film and the third transparent electrode film, intervenes between the pixel electrode 24 and the common electrode 25, which overlap each other, and insulates them from each other. Further, a second contact hole is bored through the first insulating film and the second insulating film 21F1, which intervene between the semiconductor film and the third metal film, so as to be in such a position as to overlap the source electrode 23B. The source electrode 23B and the semiconductor section 23D are connected to each other through the second contact hole. A third contact hole is bored through the first insulating film and the second insulating film 21F1 so as to be in such a position as to overlap the drain electrode 23C. The drain electrode 23C and the semiconductor section 23D are connected to each other through the third contact hole.

As shown in FIG. 5, the first metal film constitutes a second light-blocking section 33 disposed in the array substrate 21 to overlap at least the semiconductor section 23D. The second light-blocking section 33, which is disposed at a lower layer than the semiconductor section 23D, can block light emitted from the backlight device 12 toward the semiconductor section 23D from below. This makes it possible to reduce fluctuations in characteristic of the TFT 23 that may occur in a case where the semiconductor section 23D is illuminated with light. The second light-blocking section 33 has the shape of a horizontally long band extending along the X-axis direction across a plurality of the pixels PX. The second light-blocking section 33, whose width dimension varies according to position in the X-axis direction, has a minimum width dimension that is greater than the line width of a gate wire 26. The second light-blocking section 33 is disposed to overlap substantially the entirety of the semiconductor sections 23D of the respective TFTs 23 of the pixels PX that the second light-blocking section 33 overlaps. Further, the second light-blocking section 33 is disposed to overlap the entirety of the gate electrodes 23A of the TFTs 23 and overlap part or the entirety of the drain electrodes 23C. The basecoat film intervenes between the second light-blocking section 33, which is composed of the first metal film, and the semiconductor section 23D, which is composed of the semiconductor film, and keeps them insulated from each other. Further, the basecoat film makes it possible to avoid diffusion of impurities from the glass substrate 21GS into the semiconductor film.

Figure 7:
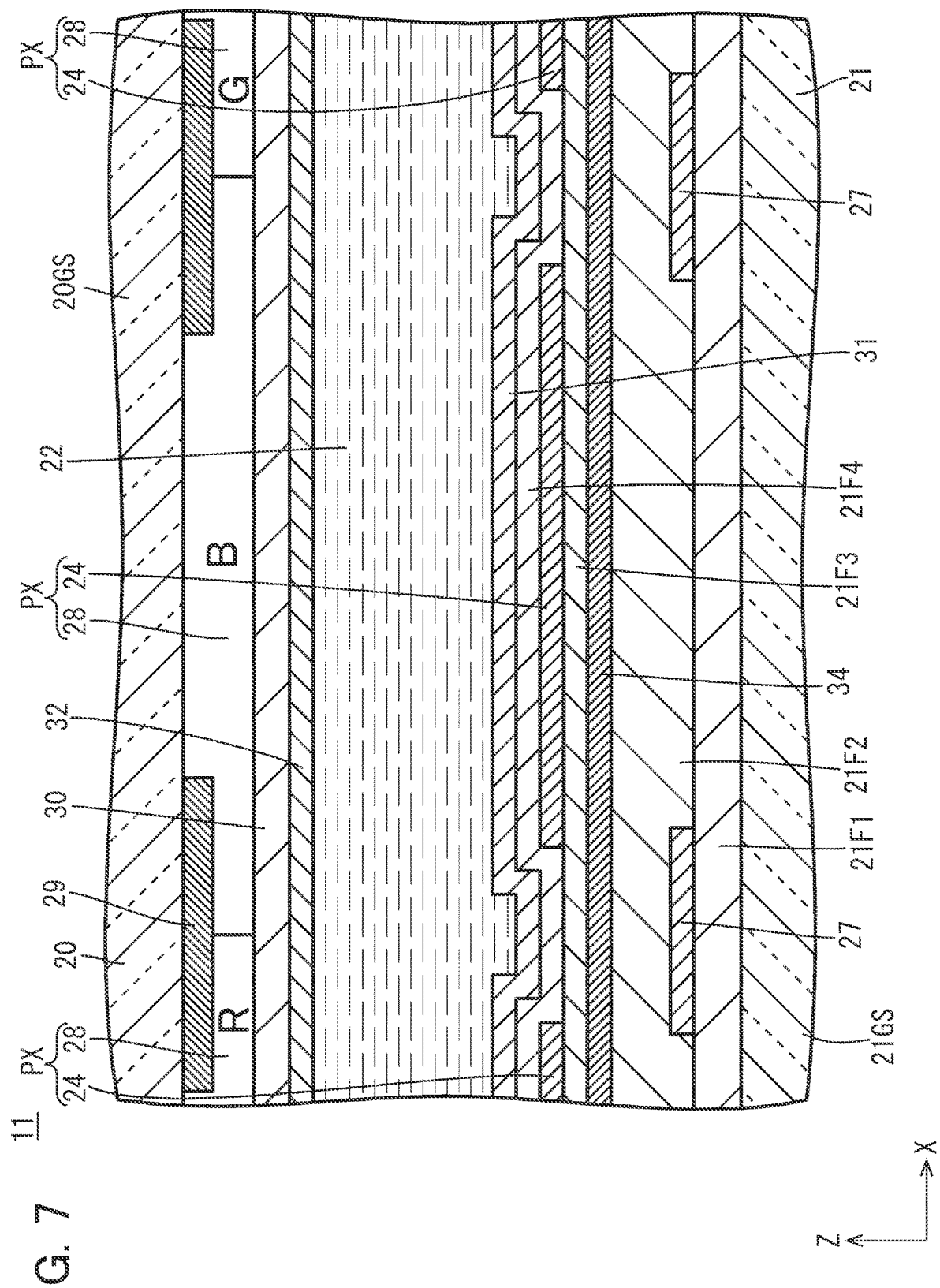
FIG. 7 is a cross-sectional view of the liquid crystal panel as taken along line VII-VII in FIG. 5.
Figure 8:
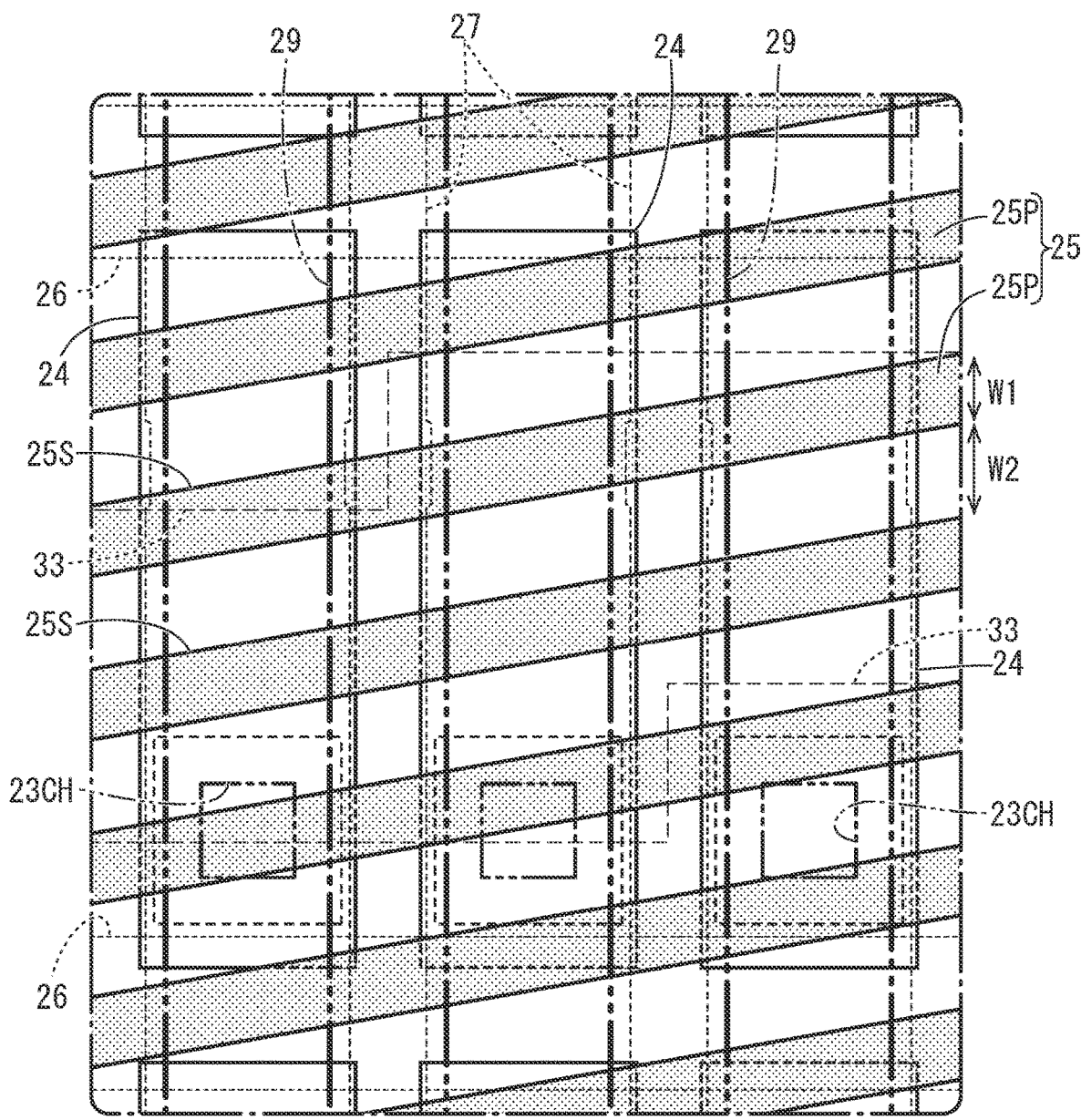
FIG. 8 is a plan view showing a pixel array in the display area of the liquid crystal panel with half-tone dot meshing representing a component composed of a third transparent electrode film.
Figure 9:
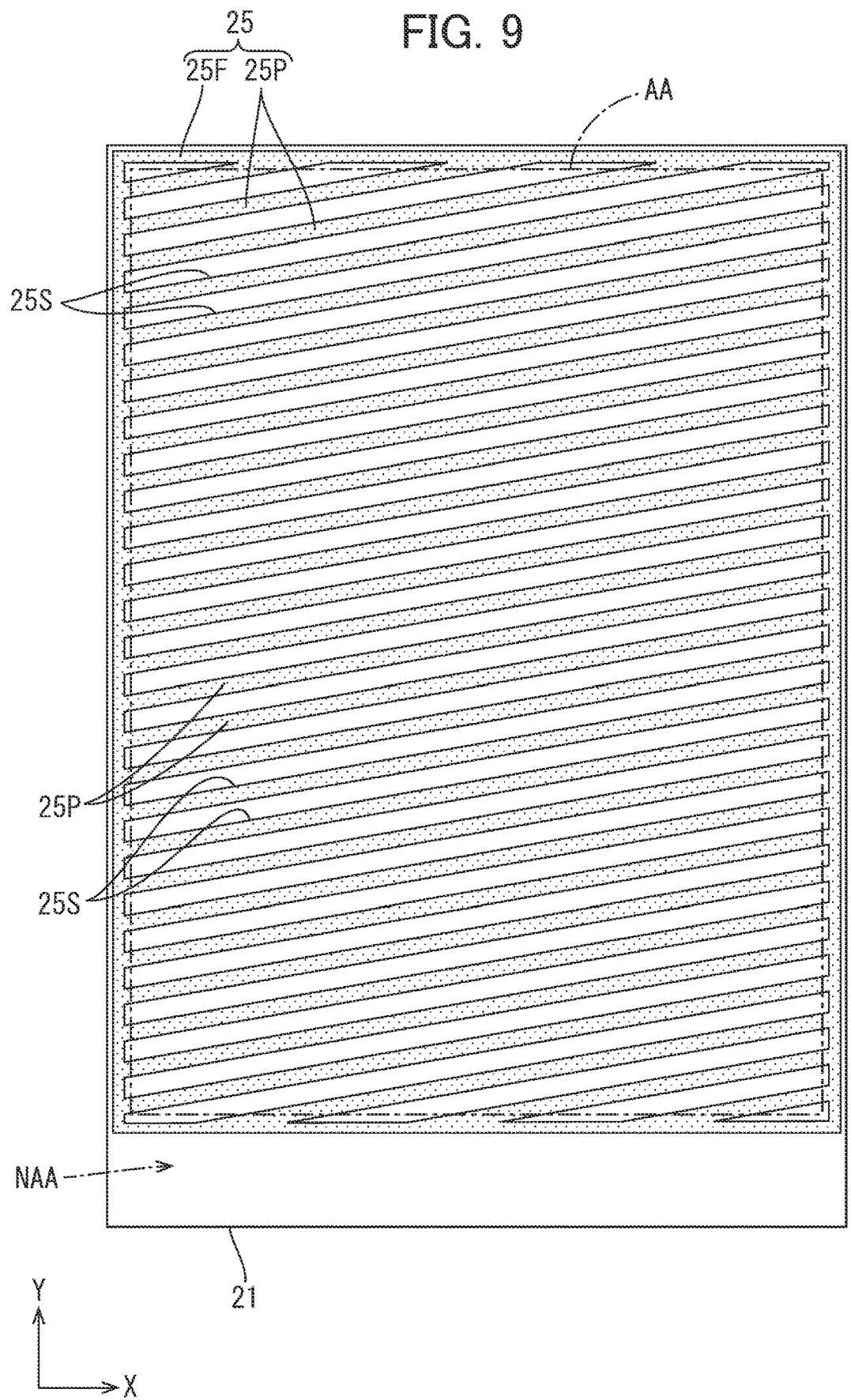
FIG. 9 is a plan view showing the whole array substrate with half-tone dot meshing representing the component composed of the third transparent electrode film.

A configuration of the common electrode 25, which is composed of the third transparent electrode film, is described in detail here mainly with reference to FIGS. 6 to 9. In FIGS. 8 and 9, a component (common electrode 25) composed of the third transparent electrode film is illustrated by half-tone dot meshing. As shown in FIG. 8, the common electrode 25 is provided with a slit 25S extending along an orientation intersecting the Y-axis direction. The slit 25S is a band-shaped opening extending along an oblique direction inclined with respect to both the X-axis direction and the Y-axis direction. Specifically, the slit 25S extends along an oblique direction inclined at approximately 80 degrees with respect to the Y-axis direction and inclined at approximately 10 degrees with respect to the X-axis direction and forms a rising diagonal stroke from bottom left to top right of FIG. 8. The slit 25S, which extends along the aforementioned oblique direction, cuts across the source wires 27 and the pixel electrode 24. A direction of extension of the slit 25 has such a relationship as to intersect the direction of alignment of the liquid crystal molecules. A plurality of the slits 25S are placed at spacings from one another in the Y-axis direction. A portion of the common electrode 25 in which the slit 25S is not formed is a common electrode section 25P. The common electrode section 25P has the shape of a band extending parallel to the slit 25S and cuts across the source wires 27 and the pixel electrode 24. A plurality of the common electrode sections 25P is placed at spacings from one another in the Y-axis direction. A slit 25S is interposed between two common electrode sections 25P that are adjacent to each other in the Y-axis direction. A common electrode section 25P is interposed between two slits 25S that are adjacent to each other in the Y-axis direction. The plurality of common electrode sections 25P and the plurality of slits 25S are alternately and repeatedly arranged in the Y-axis direction.

Incidentally, in the process of manufacture of the liquid crystal panel 11, placing the array substrate 21 and the counter substrate 20 so that their respective principal surfaces face each other may cause misregistration of the two substrates 20 and 21 in the X-axis direction. In that case, the first light-blocking section 29, which is provided in the counter substrate 20, is subjected to misregistration in the X-axis direction with respect to the source wires 27 and the pixel electrode 24, which are provided in the array substrate 21. The occurrence of this misregistration causes a decrease in the amount of light that is transmitted through the pixel electrode 24. In that respect, according to the present embodiment, the slit 25S of the common electrode 25 is extended out of range of the pixel electrode 24 as noted above. Accordingly, even in a case where higher definition has made a short-side dimension of the pixel electrode 24 as small as approximately 6 μm, a plurality of the slits 25S can be disposed to overlap the pixel electrode 24. In this way, a portion of the pixel electrode 24 that is furthest away from an edge of a slit 25S in the common electrode 25 is in a middle position between two slits 25S between which a common electrode section 25P is interposed, and is placed at a shorter distance from the edge of the slit 25S than has conventionally been the case. Note here that the amount of light that is transmitted through the pixel electrode 24 tends to decrease with distance from the edge of the slit 25S. Based on this tendency, the distance between a portion of the pixel electrode 24 that is furthest away from an edge of a slit 25S in the common electrode 25 and the edge of the slit 25S is made shorter than has conventionally been the case, whereby a larger amount of light that is transmitted through the pixel electrode 24 can be ensured than has conventionally been the case. As a result, a decrease due to the aforementioned misregistration in the amount of light that is transmitted through the pixel electrode 24 is further restrained than has conventionally been the case.

Moreover, as shown in FIG. 8, a plurality of the slits 25S are formed to extend along an orientation at a smaller angle with respect to the X-axis direction than with respect to the Y-axis direction. A larger number of slits 25S can be disposed to overlap the pixel electrode 24 than in a case where the slits 25S are formed to extend along an orientation at a larger angle with respect to the X-axis direction than with respect to the Y-axis direction. Thus, the formation of a larger number of slits 25S in the common electrode 25 reduces the array pitch between slits 25S (i.e. the width of a common electrode section 25P). Therefore, the distance between a portion of the pixel electrode 24 that is furthest away from an edge of a slit 25S in the common electrode 25 and the edge of the slit 25S is further reduced. This makes it possible to ensure a larger amount of light that is transmitted through the pixel electrode 24 than has conventionally been the case, thus further restraining a decrease due to the aforementioned misregistration in the amount of light that is transmitted through the pixel electrode 24.

Furthermore, as shown in FIG. 8, the plurality of slits 25S are formed to cut across a plurality (at least three) of the source wires 27 and a plurality (at least three) of the pixel electrodes 24 alternately and repeatedly arranged in the X-axis direction. A larger number of slits 25S are easily disposed to overlap the pixel electrode 24 than in a case where the range of formation of a slit 25S is limited to one source wire 27 and one pixel electrode 24. This makes it possible to further reduce the distance between a portion of the pixel electrode 24 that is furthest away from an edge of a slit 25S in the common electrode 25 and the edge of the slit 25S. This makes it possible to ensure a larger amount of light that is transmitted through the pixel electrode 24 than has conventionally been the case, thus further restraining a decrease due to the aforementioned misregistration in the amount of light that is transmitted through the pixel electrode 24.

As shown in FIG. 9, the plurality of slits 25S extend over the entirety of the display area AA in the array substrate 21, and are formed so that ends thereof in the direction of extension reach the non-display area NAA. As mentioned above, the plurality of slits 25S are formed to extend along an orientation at a smaller angle with respect to the X-axis direction than with respect to the Y-axis direction. Accordingly, the plurality of slits 25S include a slit 25S that cuts across all of a plurality of the source wires 27 and a plurality of the pixel electrodes 24 arranged along the X-axis direction in the display area AA. In order to ensure the viewability of the slits 25S, FIG. 9 illustrates the slits 25S exaggeratedly thicker than they actually are. Accordingly, a plurality of the common electrode sections 25P constituting the common electrode 25 extend over the entirety (entire length in the X-axis direction) of the display area AA in the array substrate 21, and are formed so that ends thereof in the direction of extension (i.e. the orientation at a smaller angle with respect to the X-axis direction than with respect to the Y-axis direction) reach the non-display area NAA. The plurality of common electrode sections 25P include a common electrode section 25P that cuts across all of a plurality of the source wires 27 and a plurality of the pixel electrodes 24 arranged along the X-axis direction in the display area AA. The common electrode 25 includes, in addition to the plurality of common electrode sections 25P, a frame section 25F joined to the plurality of common electrode sections 25P. The frame section 25F is disposed in the non-display area NAA of the array substrate 21 and has the shape of a frame extending along the non-display area NAA when seen in planar view. Both ends of each of the plurality of common electrode sections 25P in the direction of extension are joined to the frame section 25F. A wire provided in the array substrate 21 is connected to the frame section 25F, and a common potential that is transmitted to the array substrate 21 by the flexible substrate 14 is supplied to the frame section 25F by the aforementioned wire. Since the ends of the plurality of slits 25S in the direction of extension are thus disposed in the non-display area NAA, an image that is displayed in the display area AA is hardly affected even in the event of a disturbance in the alignment of the liquid crystal molecules near the ends of the slits 25S in the direction of extension. Further, by being joined to the frame section 25F disposed in the non-display area NAA, the plurality of common electrode sections 25P are supplied with a potential via the frame section 25F.

As shown in FIG. 8, a width W1 of a common electrode section 25P is smaller than a width W2 of a slit 25S. Specifically, whereas the width W1 of a common electrode section 25P is for example approximately 1.5 μm, the width W2 of a slit 25S is for example approximately 2 μm. The plurality of common electrode sections 25P have an identical width W1. The plurality of slits 25S have an identical width W2. In this way, the distance between a portion of the pixel electrode 24 that is furthest away from an edge of a slit 25S in the common electrode 25 and the edge of the slit 25S can be made shorter than in a case where the magnitude relationship in width between a common electrode section 25P and a slit 25S is reversed. This makes it possible to ensure a larger amount of light that is transmitted through the pixel electrode 24 than has conventionally been the case, thus further restraining a decrease due to the aforementioned misregistration in the amount of light that is transmitted through the pixel electrode 24.

As noted above, the common electrode 25 has formed therein a slit 25 that cuts across the source wires 27 and the pixel electrode 24. With this configuration, as shown in FIG. 7, a portion of a source wire 27 that overlaps a slit 25S is not covered with the common electrode 25 from the front. For this reason, an electric field generated from a portion of a source wire 27 that overlaps a slit 25S is not shielded against by the common electrode 25 but may affect the alignment of the liquid crystal molecules contained in the liquid crystal layer 22. This causes a disturbance in the alignment of the liquid crystal molecules, thus making it easy for leakage of light to occur and posing a risk of deterioration in display performance such as contrast performance.

Figure 10:
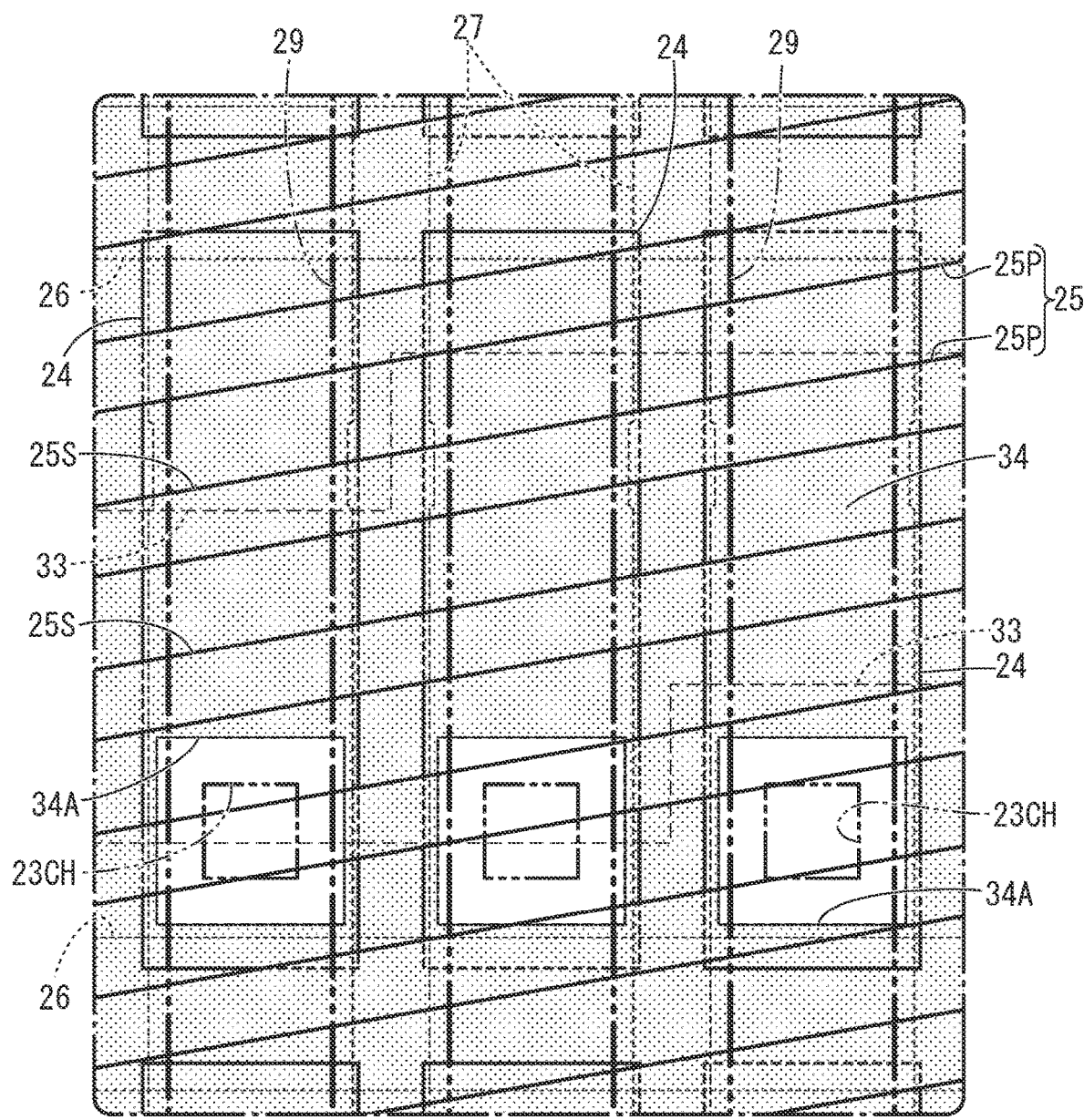
FIG. 10 is a plan view showing a pixel array in the display area of the liquid crystal panel with half-tone dot meshing representing a component composed of a first transparent electrode film.

On the other hand, as shown in FIGS. 7 and 10, the array substrate 21 according to the present embodiment is provided with a shielding electrode (third electrode, lower common electrode) 34 composed of the first transparent electrode film. A configuration of the shielding electrode 34 is described in detail below mainly with reference to FIGS. 7 and 10. In FIG. 10, a component (shielding electrode 34) composed of the first transparent electrode film is illustrated by half-tone dot meshing. The shielding electrode 34, which is composed of the first transparent electrode film, is located closer to the counter substrate 20 than the source wires 27, which are composed of the third metal film, i.e. at the front side (upper layer), and further away from the counter substrate 20 than the pixel electrode 24, which is composed of the second transparent electrode film, i.e. at the back side (lower layer). The shielding electrode 34 is supplied with a common potential signal of a common potential. Accordingly, the shielding electrode 34 and the common electrode 25 are at the same potential. Moreover, the shielding electrode 34 is disposed to overlap at least both the source wires 27 and the slit 25S. That is, a portion of a source wire 27 that overlaps the slit 25S and that is not covered with the common electrode 25 is covered with the shielding electrode 34. Accordingly, an electric field generated from a source wire 27 but not shielded against by the common electrode 25 due to the slit 25S can be satisfactorily shielded against by the shielding electrode 34. This reduces leakage of electric field due to the slit 25S, making it possible to reduce deterioration of display quality due to leakage of electric field.

As shown in FIG. 10, the shielding electrode 34 has an opening 34A overlapping the first contact hole 23CH, which is a place of connection between the pixel electrode 24 and the TFT 23 (drain electrode 23C). The pixel electrode 24, which is composed of the second transparent electrode film, is connected to the drain electrode 23C, which is composed of the third metal film, through the first contact hole 23CH of the third insulating film 21F2 and the fourth insulating film 21F3 and the opening 34A of the shielding electrode 34, which is composed of the first transparent electrode film. Moreover, in the plane of the array substrate 21, the shielding electrode 34 is disposed to solidly extend except for the opening 34A. The shielding electrode 34 extends over the entirety of the display area AA and has its outer peripheral end reaching the non-display area NAA and overlapping the frame section 25F of the common electrode 25. Accordingly, the shielding electrode 34 is disposed in the display area AA to overlap a large portion of the pixel electrode 24 except for part of the pixel electrode 24 (that is connected to the TFT 23) and overlap substantially the entirety of the source wires 27. The shielding electrode 34 thus configured makes it possible to satisfactorily shield against electric fields generated from the source wires 27 and avoid leakage of the electric fields into the liquid crystal layer 22. This makes it possible to avoid the occurrence of a disturbance in the alignment of the liquid crystal molecules due to leakage of electric field and keep good display quality.

Figure 11:
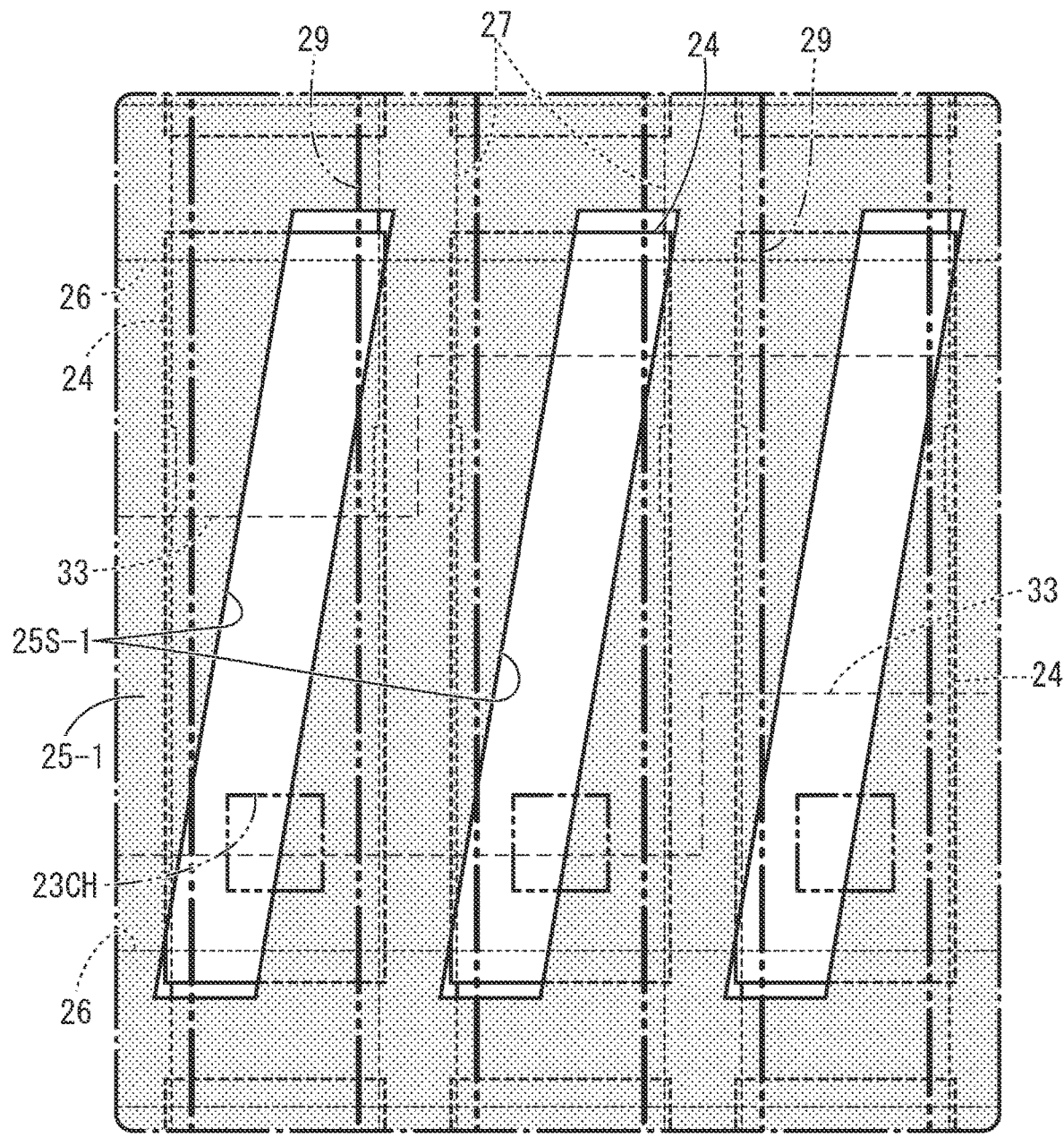
FIG. 11 is a plan view showing a pixel array in a display area of a liquid crystal panel according to Comparative Example 1 of Comparative Experiment 1 with half-tone dot meshing representing a common electrode.

Note here that the following Comparative Experiment 1 was conducted to verify the superiority of the liquid crystal panel 11 according to the present embodiment. In this Comparative Experiment 1, Example 1 was directed to a liquid crystal panel 11 configured as described in paragraphs preceding Comparative Experiment 1, and Comparative Example 1 was directed to a liquid crystal panel configured by changing to a common electrode 25-1 and removing the shielding electrode 34, which is composed of the first transparent electrode film, and the fourth insulating film 21F3. A pixel array in the liquid crystal panel according to Comparative Example 1 is as shown in FIG. 11. In FIG. 11, the common electrode 25-1 is illustrated by half-tone dot meshing. As shown in FIG. 11, the common electrode 25-1 provided in Comparative Example 1 has formed therein a slit 25S-1 limited to the range of formation of a pixel electrode 24. The slit 25S-1 extends along an oblique direction inclined at approximately 10 degrees with respect to the Y-axis direction and forms a rising diagonal stroke from bottom left to top right of FIG. 11. That is, the slit 25S-1 extends along an orientation at a smaller angle with respect to the Y-axis direction than with respect to the X-axis direction. One slit 25S-1 is disposed to overlap one pixel electrode 24, and the slit 25S-1 does not cut across a source wire 27. The slit 25S-1 has a width dimension of approximately 2 µm. In the common electrode 25-1, the spacing between two slits 25S-1 that are adjacent to each other in the X-axis direction is approximately 4 µm. It should be noted that providing one more slit 25S-1 between two slits 25S-1 that are adjacent to each other in the X-axis direction makes the spacing between slits 25S-1 approximately 1 µm, making it easy for a wire to break in the common electrode 25-1. For this reason, such a configuration is hard to achieve.

Figure 12:
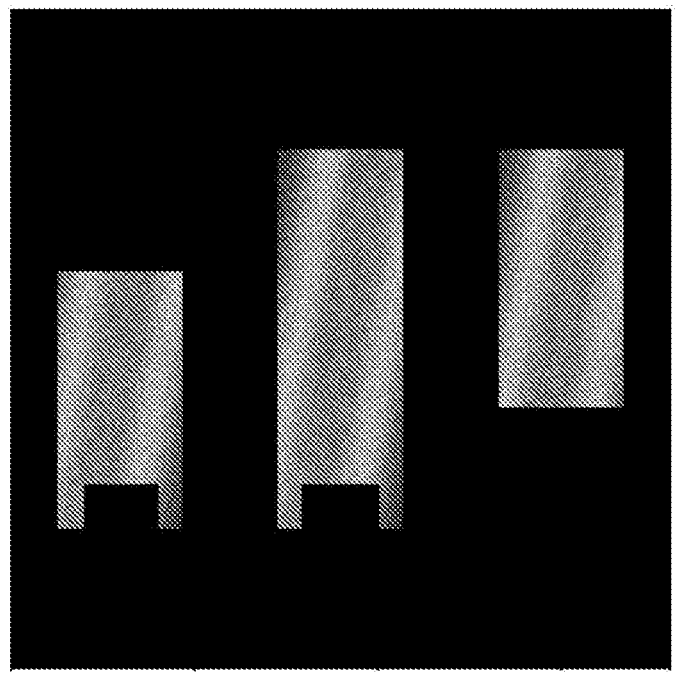
FIG. 12 is a diagram showing a transmittance distribution in the absence of misregistration of an array substrate and a counter substrate in an X-axis direction in Comparative Example 1 of Comparative Experiment 1.
Figure 13:
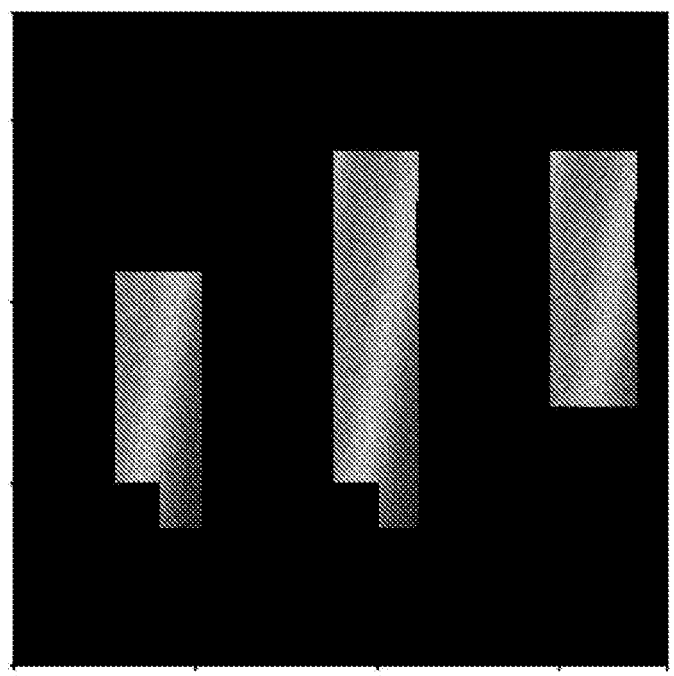
FIG. 13 is a diagram showing a transmittance distribution in the presence of misregistration of the counter substrate with respect to the array substrate in the X-axis direction in Comparative Example 1 of Comparative Experiment 1.
Figure 14:
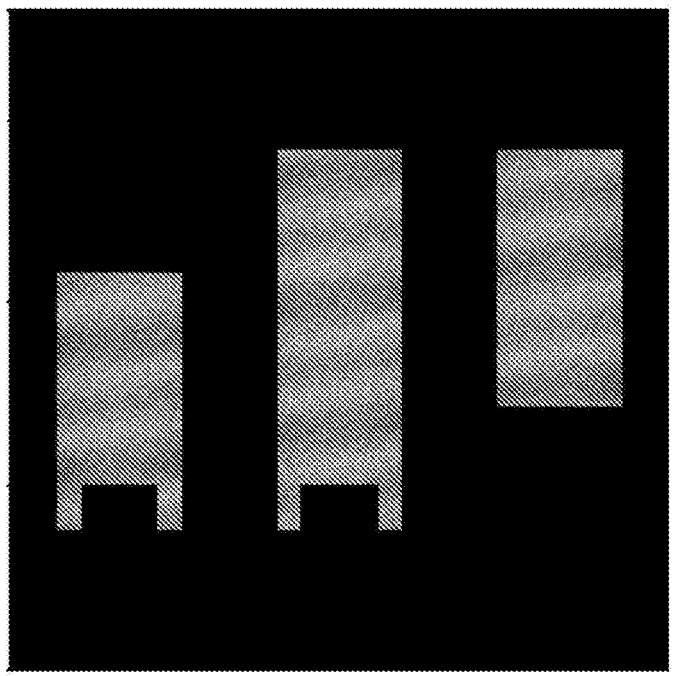
FIG. 14 is a diagram showing a transmittance distribution in the absence of misregistration of an array substrate and a counter substrate in the X-axis direction in Example 1 of Comparative Experiment 1.
Figure 15:
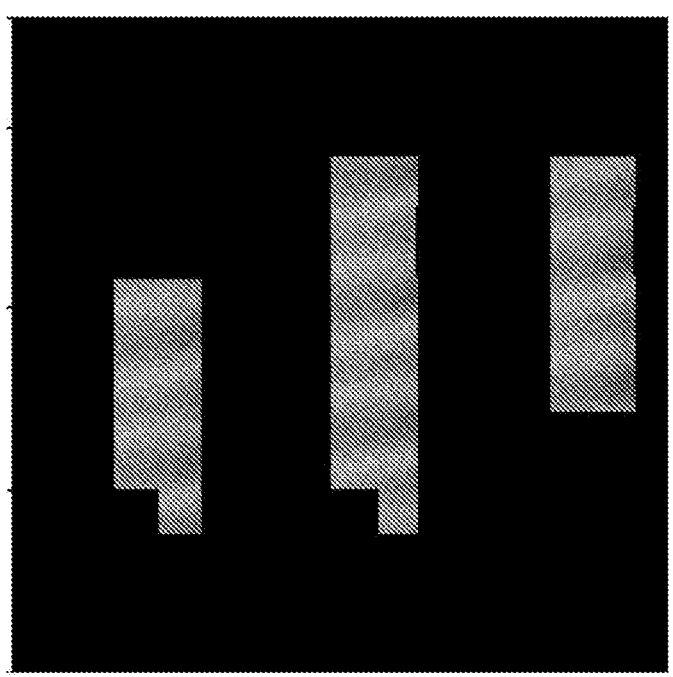
FIG. 15 is a diagram showing a transmittance distribution in the presence of misregistration of the counter substrate with respect to the array substrate in the X-axis direction in Comparative Example 1 of Comparative Experiment 1.

In Comparative Experiment 1, transmittance distributions were prepared by measuring amounts of light transmitted during a full-screen white display (display at the highest level of gray) carried out in both the absence of misregistration of the array substrate 21 and the counter substrate 20 in the X-axis direction and the presence of misregistration of the counter substrate 20 with respect to the array substrate 21 in the X-axis direction in each of the liquid crystal panels according to the aforementioned Comparative Example 1 and Example 1. The transmittance distributions according to Comparative Example 1 are shown in FIGS. 12 and 13. The transmittance distributions according to Example 1 are shown in FIGS. 14 and 15. FIGS. 12 and 14 show transmittance distributions in the absence of misregistration of the two substrates 20 and 21. FIGS. 13 and 15 show transmittance distributions in the presence of misregistration of the counter substrate 20. The counter substrate 20 is subjected to misregistration approximately 1.5 µm toward the right of FIGS. 13 and 15 with respect to the array substrate 21. In the transmittance distributions shown in FIGS. 12 to 15, shades of grayscale represent how high or low the transmittance is. The higher (brighter) the transmittance is, the lighter shade it tends to be represented by. The lower (darker) the transmittance is, the deeper shade it tends to be represented by. It should be noted that FIGS. 12 to 15 show transmittance distributions in three pixel electrodes 24 arranged in a row along the X-axis direction.

Experimental results of Comparative Experiment 1 are described. FIGS. 12 and 14 show that in both Comparative Example 1 and Example 1, the transmittance is highest in positions overlapping edges of the slits 25S and 25S-1 and the transmittance tends to gradually decrease with distance from the edges of the slits 25S and 25S-1. According to FIGS. 12 to 15, the occurrence of misregistration of the counter substrate 20 causes a left end side portion of each of the pixel electrodes 24 that is not supposed to be shielded from light by the first light-blocking section 29 to be shielded from light and causes a right end side portion of each of the pixel electrodes 24 that was supposed to be shielded from light by the first light-blocking section 29 not to be shielded from light. It should be noted that an upper end side portion of the leftmost pixel electrode 24 shown in FIGS. 12 to 15 and a lower end side portion of the rightmost pixel electrode 24 shown in FIGS. 12 to 15 are shielded from light by widened portions of the second light-blocking section 33.

Experimental results of Comparative Example 1 are described in detail. According to FIG. 12, in Comparative Example 1, the left end side portion of each of the pixel electrodes 24 contains a high proportion of portions close to an edge of a slit 25S-1 and comparatively high in transmittance, and as shown in FIG. 13, the misregistration of the counter substrate 20 causes these portions to be shielded from light by the first light-blocking section 29. Meanwhile, according to FIG. 13, the right end side portion of each of the pixel electrodes 24 contains a high proportion of portions far away from an edge of a slit 25S-1 and comparatively low in transmittance, and the misregistration of the counter substrate 20 causes these portions not to be shielded from light by the first light-blocking section 29. In particular, in Comparative Example 1, a lower right corner portion of each of the pixel electrodes 24 that is furthest away from an edge of a slit 25S-1 and lowest in transmittance is caused by the misregistration of the counter substrate 20 not to be shielded from light by the first light-blocking section 29. For this reason, in Comparative Example 1, the amount of light that is transmitted through each of the pixel electrodes 24 is much smaller in the presence of misregistration than in the absence of misregistration.

Next, Experimental results of Example 1 are described in detail. According to FIG. 14, in Example 1, the distance between a portion of each of the pixel electrodes 24 that is furthest away from an edge of a slit 25S and the edge of the slit 25S is shorter than in Comparative Example 1, as a large number of slits 25S are disposed to overlap the pixel electrode 24. Moreover, in Example 1, the right and left end side portions of each of the pixel electrodes 24 contain substantially equal proportions of portions close to an edge of a slit 25S and portions far away from a slit 25S. Accordingly, as shown in FIG. 15, although the misregistration of the counter substrate 20 causes the left end side portion of each of the pixel electrodes 24 to be shielded from light by the first light-blocking section 29 and causes the right end side portion of each of the pixel electrodes 24 not to be shielded from light by the first light-blocking section 29, a great decrease in the amount of light that is transmitted through each of the pixel electrodes 24 can be avoided. As a result, it can be said that Example 1 better restrains a decrease due to the misregistration of the counter substrate 20 in the amount of light transmitted through each of the pixel electrodes 24 than does Comparative Example 1.

Figure 16:
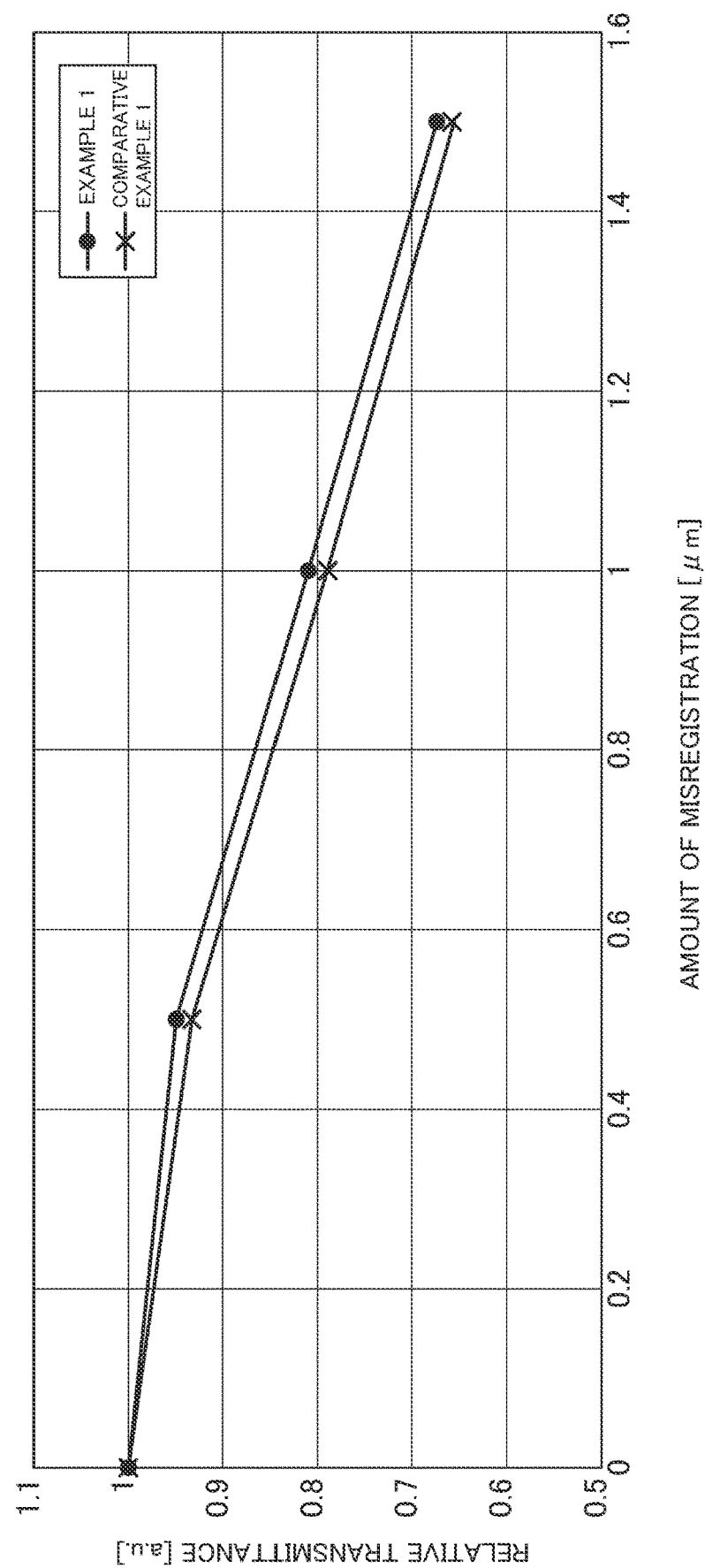
FIG. 16 is a graph representing a relationship between the amount of misregistration of a counter substrate with respect to an array substrate in the X-axis direction and relative transmittance in Comparative Experiment 2.

Next, Comparative Experiment 2 was conducted to obtain findings about how the transmittance changes with changes in the amount of misregistration in the X-axis direction of the counter substrate 20 with respect to the array substrate 21 in each of the liquid crystal panels according to Comparative Example 1 and Example 1 described in Comparative Experiment 1. In Comparative Experiment 2, the relative transmittance was calculated by measuring the amount of transmitted light in each of the liquid crystal panels according to Comparative Example 1 and Example 1 with the amount of misregistration in the X-axis direction of the counter substrate 20 with respect to the array substrate 21 varying among 0 µm, 0.5 µm, 1 µm, and 1.5 µm in each of these liquid crystal panels. The relative transmittance is a relative value normalized with reference (1.0) to a case where the amount of misregistration is 0 µm. It should be noted that the case where the amount of misregistration is 0 µm means a case where no misregistration occurred. Experimental results are shown in graph form in FIG. 16. In FIG. 16, the horizontal axis represents the amount of misregistration in the X-axis direction of the counter substrate 20 with respect to the array substrate 21 (in the unit "mm"), and the vertical axis represents the relative transmittance (arbitrary unit). Further, FIG. 16 also shows the legends of Comparative Example 1 and Example 1. The plot of "●" represents Example 1, and the plot of "x" represents Comparative Example 1.

Experimental results of Comparative Example 2 are described. FIG. 16 shows that in both Comparative Example 1 and Example 1, the larger the amount of misregistration of the counter substrate 20 becomes, the lower relative transmittance becomes. In particular, when the amount of misregistration of the counter substrate 20 exceeds 0.5 µm, the relative transmittance decreases at a greater rate. Moreover, a comparison between Comparative Example 1 and Example 1 shows that Example 1 is usually higher in relative transmittance than Comparative Example 1 in a case where the amount of misregistration of the counter substrate 20 is 0.5 µm, 1 µm, or 1.5 µm. That is, when the counter substrate 20 is subjected to misregistration, the relative transmittance of Example 1 is higher than the relative transmittance of Comparative Example 1 regardless of the amount of misregistration. Accordingly, it can be said that even if the counter substrate 20 is subjected to misregistration, Example 1 makes it possible to achieve higher transmittance than does Comparative Example 1.

Figure 17:
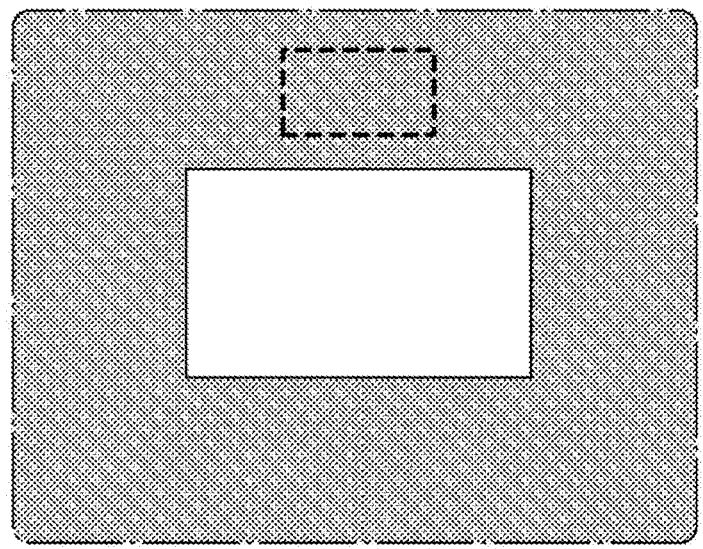
FIG. 17 is an explanatory diagram showing the state of a white display selectively carried out in a central part of a display area of a liquid crystal panel and a black display selectively carried out in a part therearound in Comparative Experiment 3.
Figure 18:
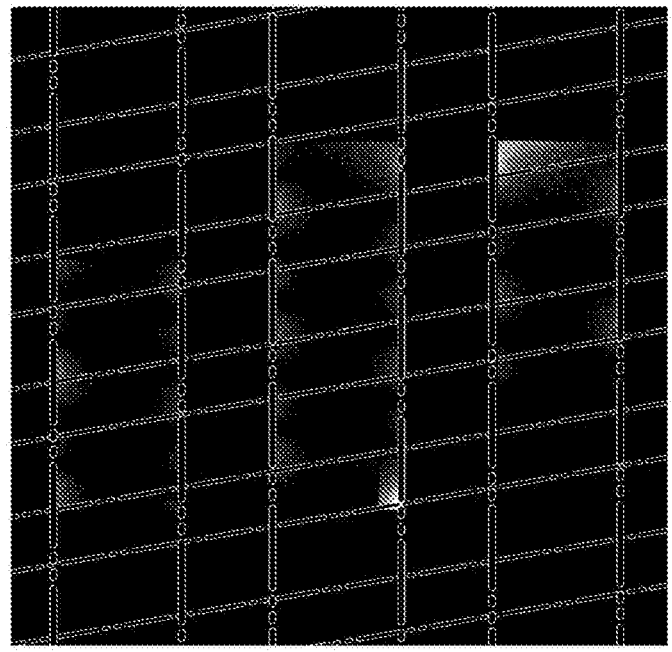
FIG. 18 is a diagram showing a transmittance distribution according to Comparative Example 2 of Comparative Experiment 3.
Figure 19:
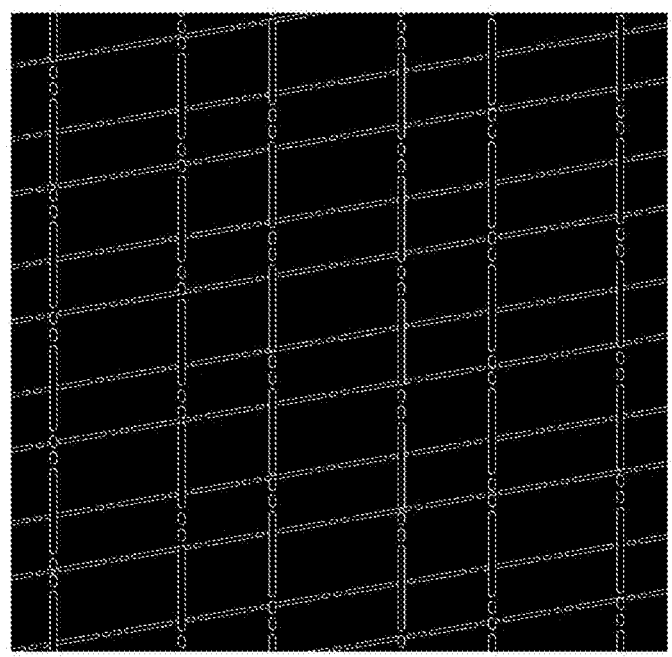
FIG. 19 is a diagram showing a transmittance distribution according to Example 1 of Comparative Experiment 3.

Next, Comparative Experiment 3 was conducted to obtain findings about a relationship between leakage of electric field and contrast performance. This Comparative Experiment 3 involves the use of Example 1 of Comparative Example 1 and Comparative Example 2, which is described next. Comparative Example 2 differs from Example 1 only in that the shielding electrode 34, which is composed of the first transparent electrode film, and the fourth insulating film 21F3 are removed, and is identical in configuration of the common electrode 25 (e.g. the slits 25S) to Example 1. In Comparative Experiment 3, as shown in FIG. 17, a white display (display at the highest level of gray) was selectively carried out in a central part of the display area AA of each of the liquid crystal panels according to Comparative Example 2 and Example 1, and a black display (display at the lowest level of gray) was selectively carried out in a part therearound. In FIG. 17, the black display portion is illustrated by half-tone dot meshing, and the white display portion is illustrated by solid white. Transmittance distributions were prepared by measuring the amount of light that is transmitted through a portion (i.e. a portion surrounded by dashed lines in FIG. 17) of the black display portion that is closer to the upper side of FIG. 17 than the white display portion. In the portion surrounded by dashed lines in FIG. 17, a potential at the highest level of gray for a white display is supplied to the source wires 27 in a one-frame display period; therefore, if electric fields from the source wires 27 leak into the liquid crystal layer 22, leakage of light may occur. The transmittance distribution according to Comparative Example 2 is shown in FIG. 18. The transmittance distribution according to Example 1 is shown in FIG. 19. In the transmittance distributions shown in FIGS. 18 and 19, shades of grayscale represent how high or low the transmittance is. The higher (brighter) the transmittance is, the lighter shade it tends to be represented by. The lower (darker) the transmittance is, the deeper shade it tends to be represented by. It should be noted that FIGS. 18 and 19 show transmittance distributions in three pixel electrodes 24 arranged in a row along the X-axis direction. Further, in Comparative Example and Example 1, the two substrates 20 and 21 are not subjected to misregistration.

Experimental results of Comparative Experiment 3 are described. FIG. 18 shows that in Comparative Example 2, leakage of light occurs at multiple places adjacent to the first light-blocking section 29 in the X-axis direction. It is inferred that in Comparative Example 2, electric fields generated from portions of the source wires 27 that overlap the slits 25S of the common electrode 25 were not shielded against by the common electrode 25 but leaked into the liquid crystal layer 22 and thereby caused a disturbance in the alignment of the liquid crystal molecule and resulted in leakage of light. On the other hand, FIG. 19 shows that in Example 1, there is no leakage of light over substantially the entire area. It is inferred that this is because electric fields generated from the source wires 27 were satisfactorily shielded against by the shielding electrode 34 provided in Example 1.

As described above, a liquid crystal panel (display device) 11 according to the present embodiment includes an array substrate (first substrate) 21, a counter substrate (second substrate) 20 having a principal surface facing a principal surface of the array substrate 21, a source wire (first wire) 27, provided in the array substrate 21, that extends along a first direction parallel with the principal surface of the array substrate 21, a pixel electrode (first electrode) 24 provided in the array substrate 21, disposed adjacent to the source wire 27 in a second direction parallel with the principal surface of the array substrate 21 and orthogonal to the first direction, and located closer to the counter substrate 20 than the source wire 27, a common electrode (second electrode) 25 provided in the array substrate 21, located closer to the counter substrate 20 than the pixel electrode 24, and disposed to overlap the source wire 27 and the pixel electrode 24, a first light-blocking section (first overlap section) 29, provided in the counter substrate 20 and disposed to overlap at least the source wire 27, that extends along the first direction and that blocks light, and a shielding electrode (third electrode) 34 provided in the array substrate 21, located closer to the counter substrate 20 than the source wire 27, and located further away from the counter substate 20 than the pixel electrode 24. A plurality of slits 25S is formed in the common electrode 25. The plurality of slits 25S is placed at spacings from one another, extends along an orientation parallel with the principal surface of the array substrate 21 that intersects the first direction, and each the plurality of slits cuts across the source wire 27 and the pixel electrode 24. The shielding electrode 34 is disposed to overlap at least both the source wire 27 and the slits 25S.

Placing the array substrate 21 and the counter substrate 20 so that their respective principal surfaces face each other may cause misregistration of the two substrates 20 and 21 in the second direction. In that case, the first light-blocking section 29, which is provided in the counter substrate 20, is subjected to misregistration in the second direction with respect to the source wire 27 and the pixel electrode 24, which are provided in the array substrate 21. The occurrence of this misregistration causes a decrease in the amount of light that is transmitted through the pixel electrode 24.

In that respect, a slit 25S of the common electrode 25 is extended along an orientation parallel with the principal surface of the array substrate 21 that intersects the first direction, and a plurality of the slits 25S cut across the source wire 27 and the pixel electrode 24 and are placed at spacings from one another. That is, by extending the slit 25S of the common electrode 25 out of range of the pixel electrode 24, whereby even in a case where higher definition has made the pixel electrode 24 small in size, a plurality of the slits 25S can be disposed to overlap the pixel electrode 24. In this way, the distance between a portion of the pixel electrode 24 that is furthest away from an edge of a slit 25S and the edge of the slit 25S can be made shorter than has conventionally been the case. Note here that the amount of light that is transmitted through the pixel electrode 24 tends to decrease with distance from the edge of the slit 25S. Based on this tendency, the distance between a portion of the pixel electrode 24 that is furthest away from an edge of a slit 25S in the common electrode 25 and the edge of the slit 25S is made shorter than has conventionally been the case, whereby a larger amount of light that is transmitted through the pixel electrode 24 can be ensured than has conventionally been the case. As a result, a decrease due to the aforementioned misregistration in the amount of light that is transmitted through the pixel electrode 24 is further restrained than has conventionally been the case.

Thus, employing a configuration in which a slit 25S cuts across the source wire 27 may affect display quality, as an electric field generated from the source wire 27 is not sufficiently shielded against by the common electrode 25. On the other hand, since the shielding electrode 34 is disposed to overlap at least both the source wire 27 and the slit 25S, an electric field generated from the source wire 27 but not shielded against by the common electrode 25 due to the slit 25S can be satisfactorily shielded against by the shielding electrode 34. This makes it possible to reduce leakage of electric field due to the slit 25S in addition to restraining a decrease in the amount of transmitted light due to misregistration of the first light-blocking section 29.

Further, the pixel electrode 24 may have a longitudinal shape along the first direction, and the common electrode 25 may have the plurality of slits 25S formed therein to extend along an orientation at a smaller angle with respect to the second direction than with respect to the first direction. A larger number of slits 25S can be disposed to overlap the pixel electrode 24 than in a case where the slits 25S of the common electrode 25 are formed to extend along an orientation at a larger angle with respect to the second direction than with respect to the first direction. This makes it possible to further reduce the distance between a portion of the pixel electrode 24 that is furthest away from an edge of a slit 25S and the edge of the slit 25S. This makes it possible to ensure a larger amount of light that is transmitted through the pixel electrode 24 than has conventionally been the case, thus further restraining a decrease due to the aforementioned misregistration in the amount of light that is transmitted through the pixel electrode 24.

Further, a plurality of the source wires 27 and a plurality of the pixel electrodes 24 may be alternately arranged in the second direction, and the common electrode 25 may have the plurality of slits 25S formed to cut across the plurality of source wires 27 and the plurality of pixel electrodes 24. A larger number of slits 25S are easily disposed to overlap the pixel electrode 24 than in a case where the range of formation of a slit 25S is limited to one source wire 27 and one pixel electrode 24. This makes it possible to further reduce the distance between a portion of the pixel electrode 24 that is furthest away from an edge of a slit 25S and the edge of the slit 25S. This makes it possible to ensure a larger amount of light that is transmitted through the pixel electrode 24 than has conventionally been the case, thus further restraining a decrease due to the aforementioned misregistration in the amount of light that is transmitted through the pixel electrode 24.

Further, the liquid crystal panel 11 may further include a liquid crystal layer 22 sandwiched between the array substrate 21 and the counter substrate 20. The principal surface of the array substrate 21 may be divided into a display area AA where the plurality of source wires 27 and the plurality of pixel electrodes 24 are disposed and where an image is displayed and a non-display area NAA where at least the plurality of pixel electrodes 24 are not disposed and where no image is displayed. The common electrode 25 may have the plurality of slits 25S formed therein to extend over an entirety of the display area AA. The common electrode 25 may have a plurality of common electrode sections (second electrode sections) 25P that extend parallel to the slits 25S, each of which cuts across the source wire 27 and the pixel electrode 24, and between which the slits 25S are interposed and a frame section 25F disposed in the non-display area NAA, joined to the plurality of common electrode sections 25P, and formed in a frame shape. Near ends of the slits 25S in the direction of extension, there tends to occur a disturbance in the state of alignment of the liquid crystal molecules contained in the liquid crystal layer 22. In that respect, since, as noted above, the plurality of slits 25S are formed in the common electrode 25 to extend over the entirety of the display area AA, the ends of the slits 25S in the direction of extension can be disposed in the non-display area NAA. As a result, an image that is displayed in the display area AA is hardly affected even in the event of a disturbance in the alignment of the liquid crystal molecules near the ends of the slits 25S in the direction of extension. Further, by being joined to the frame section 25F disposed in the non-display area NAA, the plurality of common electrode sections 25P are supplied with a potential via the frame section 25F.

Further, the common electrode 25 may have a plurality of common electrode sections 25P that extend parallel to the slits 25S, each of which cuts across the source wire 27 and the pixel electrode 24, and between which the slits 25S are interposed. A width W1 of each of the common electrode sections 25P may be smaller than a width W2 of each of the slits 25S. In this way, the distance between a portion of the pixel electrode 24 that is furthest away from an edge of a slit 25S and the edge of the slit 25S can be made shorter than in a case where the magnitude relationship in width between a common electrode section 25P and a slit 25S is reversed. This makes it possible to ensure a larger amount of light that is transmitted through the pixel electrode 24 than has conventionally been the case, thus further restraining a decrease due to the aforementioned misregistration in the amount of light that is transmitted through the pixel electrode 24.

Further, the liquid crystal panel 11 may further include a TFT (switching element) 23 provided in the array substrate 21 and connected to the source wire 27 and the pixel electrode 24. The shielding electrode 34 may have an opening 34A overlapping a place of connection between the source electrode 27 and the switching element 23 and be disposed to solidly extend except for the opening 34A. In this way, a connection between the TFT 23 and the pixel electrode 24 can be made through the opening 34A of the shielding electrode 34, which is located closer to the counter substrate 20 than the source wire 27 and located further away from the counter substate 20 than the pixel electrode 24. The shielding electrode 34, which is disposed to solidly extend except for the opening 34A, can satisfactorily shield against an electric field generated from the source wire 27.

Further, the first light-blocking section 29 may be disposed to overlap an edge of the pixel electrode 24 extending along the first direction. In the event of misregistration of the first light-blocking section 29 in the second direction, an edge of the pixel electrode 24 that is supposed to be shielded from light by overlapping the first light-blocking section 29 may cease to be shielded from light by the first light-blocking section 29. Even in that case, the distance between a portion of the pixel electrode 24 that is furthest away from an edge of a slit 25S and the edge of the slit 25S can be made shorter than has conventionally been the case, as the plurality of slits 25S are disposed to overlap the pixel electrode 24. This makes it possible to ensure a larger amount of light that is transmitted through the pixel electrode 24 than has conventionally been the case, thus further restraining a decrease due to the aforementioned misregistration in the amount of light that is transmitted through the pixel electrode 24.

Embodiment 2

Embodiment 2 is described with reference to FIG. 20 or 21. Embodiment 2 illustrates a change in configuration of a common electrode 125. It should be noted that a repeated description of structures, actions, and effects which are similar to those of Embodiment 1 is omitted.

Figure 20:
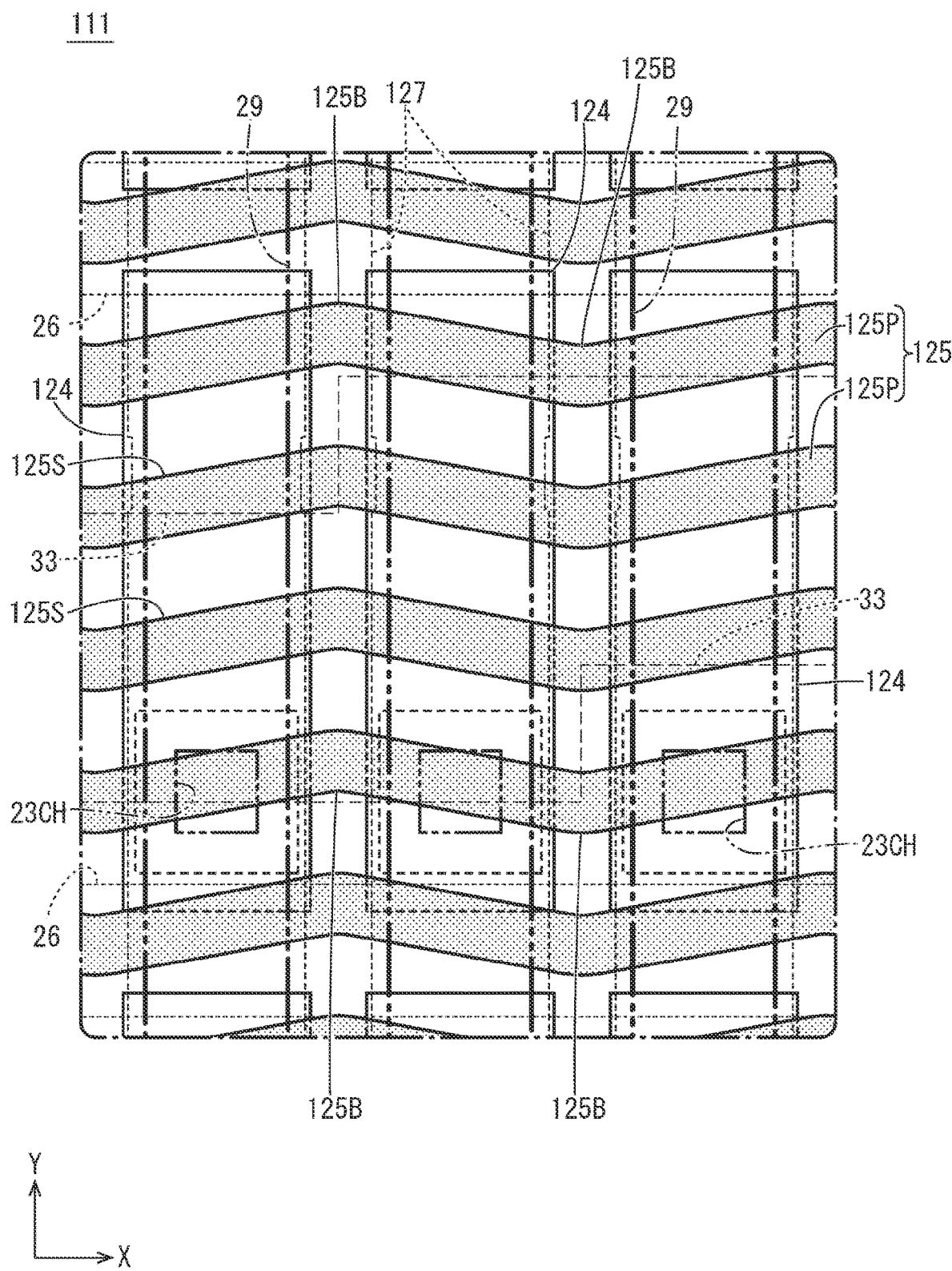
FIG. 20 is a plan view showing a pixel array in a display area of a liquid crystal panel according to Embodiment 2 with half-tone dot meshing representing a component composed of a first transparent electrode film.
Figure 21:
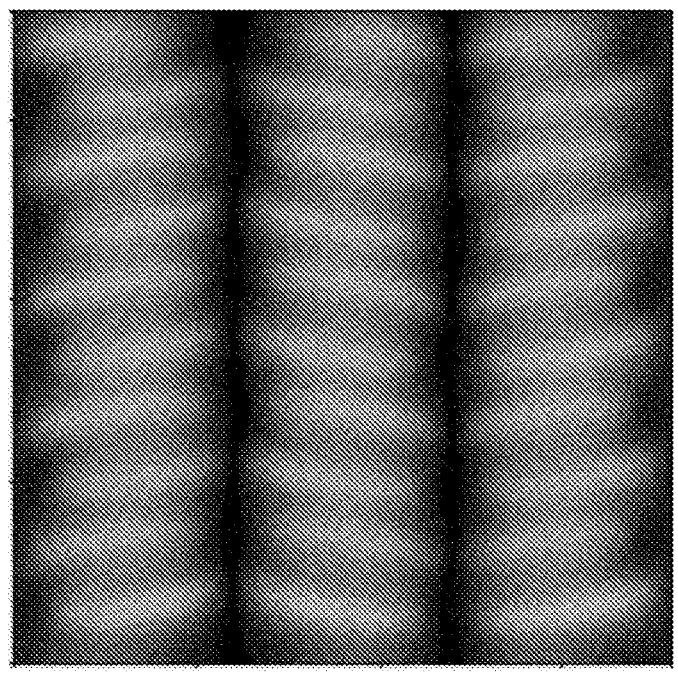
FIG. 21 is a diagram showing a transmittance distribution according to Example 2 of Demonstration Experiment 1.

As shown in FIG. 20, the common electrode 125 has a plurality of slits 125S formed therein to extend along an oblique direction inclined with respect to both the X-axis direction and the Y-axis direction and repeatedly bend in a zigzag pattern. A plurality of common electrode sections 125P are formed to extend parallel to the slits 125S and repeatedly bend in a zigzag pattern.

Specifically, each of the slits 125S is configured such that an inclined portion (first inclined slit) thereof rising from bottom left to top right of FIG. 20 and an inclined portion (second inclined slit) thereof falling from top left to bottom right of FIG. 20 are alternately and repeatedly joined to each other in the X-axis direction. An inclined portion of each of the slits 125S rising from bottom left to top right of FIG. 20 and an inclined portion of the slit 125S falling from top left to bottom right of FIG. 20 both form an identical angle of approximately 10 degrees with respect to the X-axis direction. Each of the common electrode sections 125P is configured such that an inclined portion (first inclined section) thereof rising from bottom left to top right of FIG. 20 and an inclined portion (second inclined section) thereof falling from top left to bottom right of FIG. 20 are alternately and repeatedly joined to each other in the X-axis direction. An inclined portion of each of the common electrode sections 125P rising from bottom left to top right of FIG. 20 and an inclined portion of the common electrode section 125P falling from top left to bottom right of FIG. 20 both form an identical angle of approximately 10 degrees with respect to the X-axis direction. The slits 125S and the common electrode sections 125P each have a bent section 125B at a joint between two inclined portions joined to each other. In such a configuration, when there is a potential difference between a pixel electrode 124 and the common electrode 125, it becomes hard for the liquid crystal molecules of the liquid crystal layer 22 (see FIG. 6) to rotate near the bend sections 125B of the slits 125S and the common electrode sections 125P. This causes the liquid crystal layer 22 to include a domain extending along the direction of extension of the slits 125S (i.e. an area having a particular direction of alignment), and the domain is divided into a plurality of domains bounded by the bend sections 125B of the slits 125S and the common electrode sections 125P. The liquid crystal molecules contained in the liquid crystal molecules 22 tend to move faster as the domains become smaller. Accordingly, the zig-zag bending of the slits 125S causes the liquid crystal layer 22 to include fragmented domains, thus leading to higher response speeds.

Moreover, the bend sections 125B of a plurality of the slits 125S and a plurality of the common electrode sections 125P are disposed to overlap a source wire 127. That is, the slits 125S and the common electrode sections 125P extend while being bent every time they cut across a plurality of the source wires 127 arranged at spacings from one another in the X-axis direction. The number of bend sections 125B (number of bends) of a slit 125S and a common electrode section 125P and the number of source wires 127 that are arranged in the X-axis direction are equal to each other. The length between two bend sections 125B of a slit 125S or a common electrode section 125P is approximately equal to the spacing between two source wires 127 between which a pixel electrode 124 is interposed, i.e. the array spacing between pixel electrodes 124 in the X-axis direction. This causes the liquid crystal layer 22 to include domains divided from one another separately for each of the pixel electrodes 124 arranged in the X-axis direction. That is, the length of a domain is approximately equal to the array spacing between pixel electrodes 124 in the X-axis direction. This causes the liquid crystal layer 22 to include further fragmented domains, thus leading to even higher response speeds.

Demonstration Experiment 1 was conducted using a liquid crystal panel 111 according to the present embodiment. In Demonstration Experiment 1, Example 2 was directed to a liquid crystal panel 111 configured as described in paragraphs preceding the present paragraph. In Demonstration Experiment 1, a transmittance distribution was prepared by measuring the amount of light transmitted during a full-screen white display (display at the highest level of gray) carried out in the liquid crystal panel 111 according to Example 2. It should be noted that the first light-blocking section 29 is omitted from the liquid crystal panel 111 according to Example 2. The transmittance distribution according to Example 2 is shown in FIG. 21. In the transmittance distribution shown in FIG. 21, shades of grayscale represent how high or low the transmittance is. The higher (brighter) the transmittance is, the lighter shade it tends to be represented by. The lower (darker) the transmittance is, the deeper shade it tends to be represented by. It should be noted that FIG. 21 shows a transmittance distribution in three pixel electrodes 124 arranged in a row along the X-axis direction.

Experimental results of Demonstration Experiment 1 are described. FIG. 21 shows that in Example 2, dark sections intervene between a plurality of domains bounded by the bend sections 125B of the slits 125S. It is inferred that this is because liquid crystal molecules of the liquid crystal layer 22 near the bend sections 125B cease to rotate and come to be viewed as dark sections. Since liquid crystal molecules cease to rotate near the bend sections 125B, the liquid crystal layer 22 is divided into a plurality of domains bounded by the bend sections 125B. The division of the liquid crystal layer 22 into a plurality of domains causes liquid crystal molecules in each domain to move faster. This leads to higher response speeds.

As described above, the liquid crystal panel 111 according to the present embodiment may further include a liquid crystal layer 22 sandwiched between the array substrate 21 and the counter substrate 20. The common electrode 125 may have the plurality of slits 125S formed therein to extend along an oblique direction inclined with respect to both the first direction and the second direction and bend in a zigzag pattern. The liquid crystal layer 22 includes a domain extending along the direction of extension of the slits 125S, and the domain is divided into a plurality of domains bounded by the bend sections 125B of the slits 125S. The liquid crystal molecules contained in the liquid crystal molecules 22 tend to move faster as the domains become smaller. Accordingly, the zig-zag bending of the slits 125S causes the liquid crystal layer 22 to include fragmented domains, thus leading to higher response speeds.

Further, a plurality of the source wires 127 and a plurality of the pixel electrodes 124 may be alternately arranged in the second direction, and the common electrode 125 may have the plurality of slits 125S formed therein to have bent sections 125B overlapping the source wire 127. The liquid crystal layer 22 includes domains divided from one another separately for each of the pixel electrodes 124 arranged in the second direction. This causes the liquid crystal layer 22 to include further fragmented domains, thus leading to even higher response speeds.

Embodiment 3

Embodiment 3 is described with reference to FIG. 22. Embodiment 3 illustrates a change in configuration of a common electrode 225 from Embodiment 1 described above. It should be noted that a repeated description of structures, actions, and effects which are similar to those of Embodiment 1 is omitted.

Figure 22:
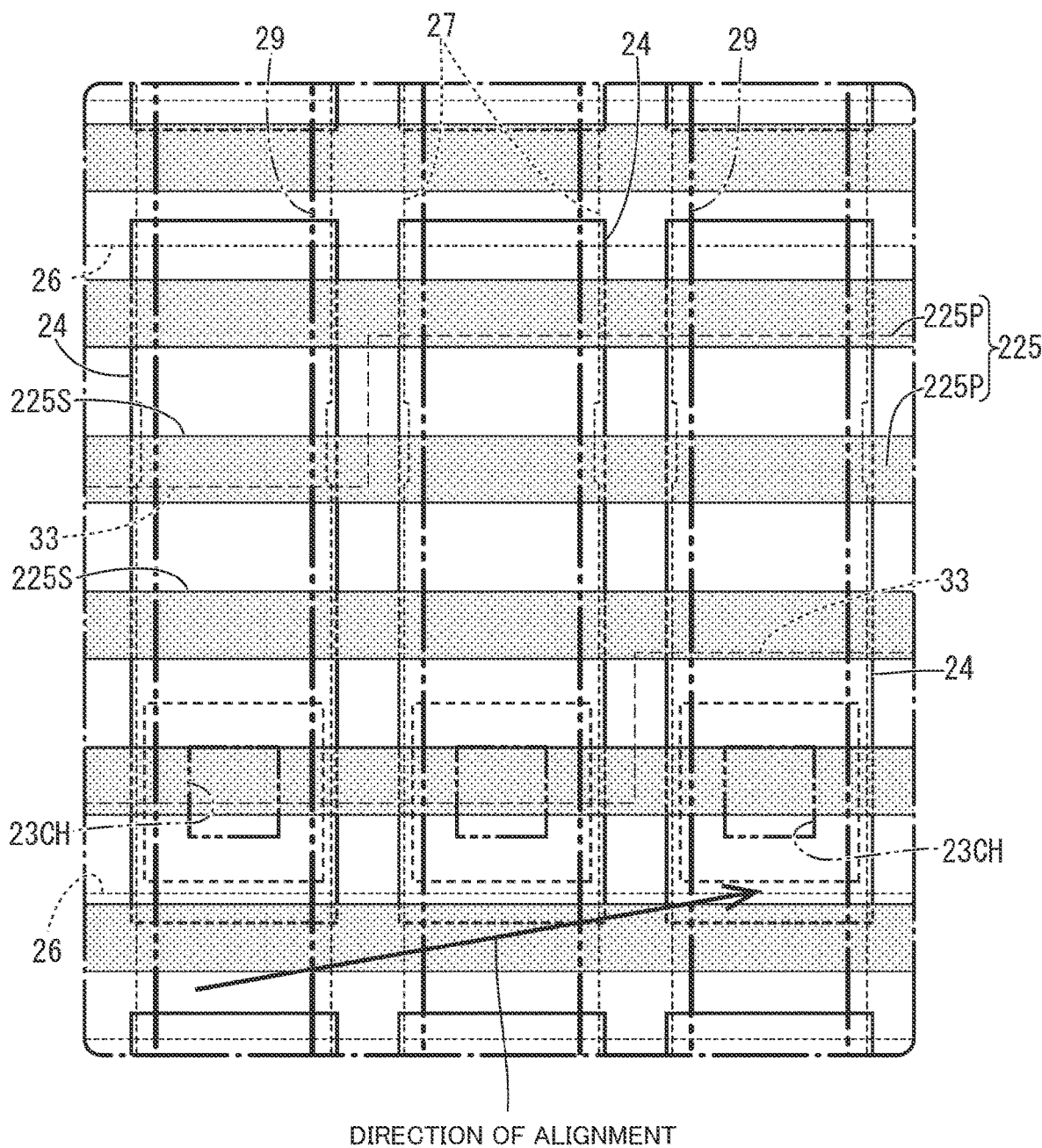
FIG. 22 is a plan view showing a pixel array in a display area of a liquid crystal panel according to Embodiment 3 with half-tone dot meshing representing a component composed of a first transparent electrode film.

As shown in FIG. 22, the common electrode 225 according to the present embodiment has a plurality of slits 225S extending substantially straight along the X-axis direction. A plurality of common electrode sections 225P extends substantially straight along the X-axis direction in parallel with the slits 225S. On the other hand, the direction of alignment of the liquid crystal molecules in the present embodiment is an oblique direction inclined at approximately 10 degrees with respect to the X-axis direction and forms a rising diagonal stroke from bottom left to top right of FIG. 22. In FIG. 22, the direction of alignment of the liquid crystal molecules is indicated by an arrow. Accordingly, the direction of extension of the slits 225S and the direction of alignment of the liquid crystal molecules have such a relationship as to intersect each other.

Other Embodiments

The present disclosure is not limited to the embodiments described above with reference to the drawings. The following embodiments may be included in the technical scope of the present disclosure.

(1) Specific angles that the slits 25S, 125S, and 225S and the common electrode sections 25P, 125P, and 225P form with respect to the X-axis direction are subject to appropriate change. In that case, it is preferable that the directions of extension of the slits 25S, 125S, and 225S and the common electrode sections 25P, 125P, and 225P be inclined at an angle smaller than 45 degrees with respect to the X-axis direction, although it is not necessarily the case.

(2) Specific lengths of the slits 25S, 125S, and 225S and the common electrode sections 25P, 125P, and 225P are subject to appropriate change. For example, the slits 25S, 125S, and 225S and the common electrode sections 25P, 125P, and 225P may have lengths shorter than the entire length in the X-axis direction of the display area AA. In that case, the slits 25S, 125S, and 225S and the common electrode sections 25P, 125P, and 225P have their ends present in the display area AA. In a case where the lengths of the slits 25S, 125S, and 225S and the common electrode sections 25P, 125P, and 225P are changed, it is preferable that the slits 25S, 125S, and 225S and the common electrode sections 25P, 125P, and 225P have such lengths as to cut across a plurality of source wires 27 and 127 and a plurality of pixel electrodes 24 and 124, although it is not necessarily the case.

(3) Specific widths of the slits 25S, 125S, and 225S and the common electrode sections 25P, 125P, and 225P are subject to appropriate change. For example, the slits 25S, 125S, and 225S and the common electrode sections 25P, 125P, and 225P may be identical in width. Further, the slits 25S, 125S, and 225S may be smaller in width than the common electrode sections 25P, 125P, and 225P.

(4) A specific range of formation of the shielding electrode 34 is subject to appropriate change. For example, the shielding electrode 34 may be selectively formed in such a range as to overlap the slits 25S, 125S, and 225S of the common electrodes 25, 125, and 225. In that case, the shielding electrode 34 has slits in positions overlapping the common electrode sections 25P, 125P, and 225P of the common electrodes 25, 125, and 225.

(5) The first light-blocking section 29 may be designed not to overlap the pixel electrodes 24 and 124.

(6) In the configuration described in Embodiment 1, the directions of extension of the slit 25S and the common electrode section 25P may form a rising diagonal stroke from bottom right to top left of FIG. 8 with respect to the X-axis direction.

(7) In the configuration described in Embodiment 2, the number of bend sections 125B (number of bends) of a slit 125S and a common electrode section 125P may be smaller than the number of source wires 127 that are arranged in the X-axis direction. For example, every time the slit 125S and the common electrode section 125P cut across a plurality of pixel electrodes 124, the slit 125S and the common electrode section 125P may be bent in positions overlapping a source wire 127.

(8) In the configuration described in Embodiment 3, the direction of alignment of the liquid crystal molecules may form a rising diagonal stroke from bottom right to top left of FIG. 22 with respect to the X-axis direction.

(9) Specific angles that the directions of extension of the slits 25S, 125S, and 225S and the common electrode sections 25P, 125P, and 225P and the direction of alignment of the liquid crystal molecules form with each other may be appropriately changed to angles other than 10 degrees.

(10) Specific planar shapes of the pixel electrodes 24 and 124 may be appropriately changed to shapes other than vertically long squares.

(11) The second light-blocking section 33 may be omitted.

(12) Patterns of the gate wires 26 and the source wires 27 and 127 in planar view are subject to appropriate change. For example, at least either the gate wires 26 or the source wires 27 and 127 may not linearly extend but obliquely extend and be repeatedly bent in the middle.

(13) Specific numerical values regarding the array pitch between pixels PX and the line widths of the gate wires 26 and the source wires 27 and 127 are subject to appropriate change. Further, specific numerical values of the pixel densities of the liquid crystal panels 11 and 111 are subject to appropriate change.

(14) The TFT 23 may be of a bottom-gate type instead of a top-gate type.

(15) The semiconductor film may be an amorphous silicon thin film, an oxide semiconductor thin film, or other films.

(16) The display mode of each of the liquid crystal panels 11 and 111 may be an IPS mode or other modes.

(17) The planar shape of each of the liquid crystal panels 11 and 111 may be a horizontally long rectangle, a square, a circle, a semicircle, an oval, an ellipse, a trapezoid, or other shapes.

(18) The liquid crystal layer 22 may be made of a negative liquid crystal material whose dielectric constant anisotropy is negative. In that case, in the configurations described in Embodiments 1 and 2, the direction of alignment of the liquid crystal molecules may be parallel with the Y-axis direction. In the configuration described Embodiment 3, the direction of alignment of the liquid crystal molecules may be inclined at approximately 10 degrees with respect to the Y-axis direction.

(19) Beside the head-mounted display 10HMD, a device, such as a headup display or a projector, that uses a lens or other components to carry out an enlarged display of an image displayed on the liquid crystal panel 11 or 111 may be applied. Further, a display device without an enlarged display function (such as a television receiver, a tablet terminal, or a smartphone) may be applied.

The present disclosure contains subject matter related to that disclosed in Japanese Priority Patent Application JP 2022-072285 filed in the Japan Patent Office on Apr. 26, 2022, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a first substrate;
a second substrate having a principal surface facing a principal surface of the first substrate;
a first wire, provided in the first substrate, that extends along a first direction parallel with the principal surface of the first substrate;
a first electrode provided in the first substrate, disposed adjacent to the first wire in a second direction parallel with the principal surface of the first substrate and orthogonal to the first direction, and located closer to the second substrate than the first wire;
a second electrode provided in the first substrate, located closer to the second substrate than the first electrode, and disposed to overlap the first wire and the first electrode;
a first overlap section, provided in the second substrate and disposed to overlap at least the first wire, that extends along the first direction and that blocks light; and
a third electrode provided in the first substrate, located closer to the second substrate than the first wire, and located further away from the second substate than the first electrode,
wherein
a plurality of slits is formed in the second electrode, the plurality of slits being placed at spacings from one another, extending along an orientation parallel with the principal surface of the first substrate that intersects the first direction, and cutting across the first wire and the first electrode, and
the third electrode is disposed to overlap at least both the first wire and the slits.

2. The display device according to claim 1, wherein
the first electrode has a longitudinal shape along the first direction, and
the second electrode has the plurality of slits formed therein to extend along an orientation at a smaller angle with respect to the second direction than with respect to the first direction.

3. The display device according to claim 1, wherein
a plurality of the first wires and a plurality of the first electrodes are alternately arranged in the second direction, and
the second electrode has the plurality of slits formed therein to cut across the plurality of first wires and the plurality of first electrodes.

4. The display device according to claim 3, further comprising a liquid crystal layer sandwiched between the first substrate and the second substrate,
wherein
the principal surface of the first substrate is divided into a display area where the plurality of first wires and the plurality of first electrodes are disposed and where an image is displayed and a non-display area where at least the plurality of first electrodes are not disposed and where no image is displayed,
the second electrode has the plurality of slits formed therein to extend over an entirety of the display area, and
the second electrode has a plurality of second electrode sections that extend parallel to the slits, each of which cuts across the first wire and the first electrode, and between which the slits are interposed and a frame section disposed in the non-display area, joined to the plurality of second electrode sections, and formed in a frame shape.

5. The display device according to claim 1, wherein the second electrode has a plurality of second electrode sections that extend parallel to the slits, each of which cuts across the first wire and the first electrode, and between which the slits are interposed, and a width of each of the second electrode sections is smaller than a width of each of the slits.

6. The display device according to claim 1, further comprising a switching element provided in the first substrate and connected to the first wire and the first electrode,
wherein the third electrode has an opening overlapping a place of connection between the first electrode and the switching element and is disposed to solidly extend except for the opening.

7. The display device according to claim 1, wherein the first overlap section is disposed to overlap an edge of the first electrode extending along the first direction.

8. The display device according to claim 1, further comprising a liquid crystal layer sandwiched between the first substrate and the second substrate,
wherein the second electrode has the plurality of slits formed therein to extend along an oblique direction inclined with respect to both the first direction and the second direction and bend in a zigzag pattern.

9. The display device according to claim 8, wherein
a plurality of the first wires and a plurality of the first electrodes are alternately arranged in the second direction, and
the second electrode has the plurality of slits formed therein to have bent sections overlapping the first wire.

* * * * *